United States Patent
Chung et al.

(10) Patent No.: US 10,276,640 B2
(45) Date of Patent: Apr. 30, 2019

(54) DISPLAY DEVICE

(71) Applicant: Samsung Display Co., Ltd., Yongin-si, Gyeonggi-Do (KR)

(72) Inventors: Yun-Mo Chung, Yongin-si (KR); Ho-Jin Yoon, Hwaseong-si (KR); Byoung-Ki Kim, Seoul (KR); Dae-Woo Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 90 days.

(21) Appl. No.: 15/221,023

(22) Filed: Jul. 27, 2016

(65) Prior Publication Data
US 2017/0070679 A1    Mar. 9, 2017

(30) Foreign Application Priority Data

Sep. 4, 2015   (KR) .......................... 10-2015-0125284

(51) Int. Cl.
| | |
|---|---|
| *G06F 1/16* | (2006.01) |
| *H04N 7/14* | (2006.01) |
| *H01L 27/32* | (2006.01) |
| *H01L 51/52* | (2006.01) |
| *H04N 5/225* | (2006.01) |
| *H04N 5/369* | (2011.01) |
| *G09G 3/3225* | (2016.01) |
| *G09G 3/3266* | (2016.01) |
| *G09G 3/3275* | (2016.01) |

(52) U.S. Cl.
CPC ........ *H01L 27/3234* (2013.01); *G06F 1/1605* (2013.01); *G09G 3/3225* (2013.01); *G09G 3/3266* (2013.01); *G09G 3/3275* (2013.01); *H01L 27/3211* (2013.01); *H01L 27/3216* (2013.01); *H01L 51/5271* (2013.01); *H04N 5/2257* (2013.01); *H04N 5/3696* (2013.01); *H04N 7/142* (2013.01); *G09G 2300/0421* (2013.01); *G09G 2300/0452* (2013.01); *G09G 2320/0646* (2013.01); *H01L 27/326* (2013.01)

(58) Field of Classification Search
CPC .............. H04N 5/3696; H01L 27/3211; H01L 27/3216; H01L 27/3225; H01L 27/3234
See application file for complete search history.

(56) References Cited

U.S. PATENT DOCUMENTS

| | | | | |
|---|---|---|---|---|
| 5,414,547 A | * | 5/1995 | Matsuo | ............ G02F 1/136209 349/44 |
| 5,585,817 A | * | 12/1996 | Itoh | ....................... G02F 1/1354 345/104 |
| 7,242,449 B1 | * | 7/2007 | Yamazaki | ............ G02F 1/1362 257/E27.111 |
| 7,420,608 B2 | * | 9/2008 | Yamasaki | ............ G06F 3/0412 257/E27.13 |

(Continued)

FOREIGN PATENT DOCUMENTS

| | | |
|---|---|---|
| EP | 2469852 A1 | 6/2012 |
| KR | 2005-0040447 A | 5/2005 |

*Primary Examiner* — Daniel M Pasiewicz
(74) *Attorney, Agent, or Firm* — Innovation Counsel LLP

(57) ABSTRACT

A display device includes a substrate, an encapsulation unit opposite to the substrate, a display unit disposed between the substrate and the encapsulation unit and including a pixel, a camera unit disposed on one side of the substrate and including at least one camera module, and a mirror member disposed on one side of the encapsulation unit.

23 Claims, 22 Drawing Sheets

(56) References Cited

U.S. PATENT DOCUMENTS

| | | | |
|---|---|---|---|
| 8,810,553 B2 * | 8/2014 | Sano | G09G 3/3406 |
| | | | 345/207 |
| 2007/0002130 A1 * | 1/2007 | Hartkop | H04N 7/141 |
| | | | 348/14.16 |
| 2008/0106628 A1 * | 5/2008 | Cok | H04N 7/144 |
| | | | 348/333.01 |
| 2010/0283765 A1 * | 11/2010 | Gotoh | G06F 3/0412 |
| | | | 345/175 |
| 2011/0102308 A1 * | 5/2011 | Nakamura | H01L 27/14601 |
| | | | 345/84 |
| 2011/0298953 A1 | 12/2011 | Nakamura | |
| 2012/0162490 A1 | 6/2012 | Chung et al. | |
| 2012/0176298 A1 * | 7/2012 | Suh | H01L 27/3234 |
| | | | 345/82 |
| 2012/0267611 A1 * | 10/2012 | Chung | H01L 27/3211 |
| | | | 257/40 |
| 2012/0299472 A1 | 11/2012 | Chung et al. | |
| 2014/0160411 A1 | 6/2014 | Yim et al. | |
| 2014/0312321 A1 | 10/2014 | Yoo et al. | |
| 2016/0329368 A1 * | 11/2016 | Ohmaru | H01L 27/14616 |

* cited by examiner

FIG. 10
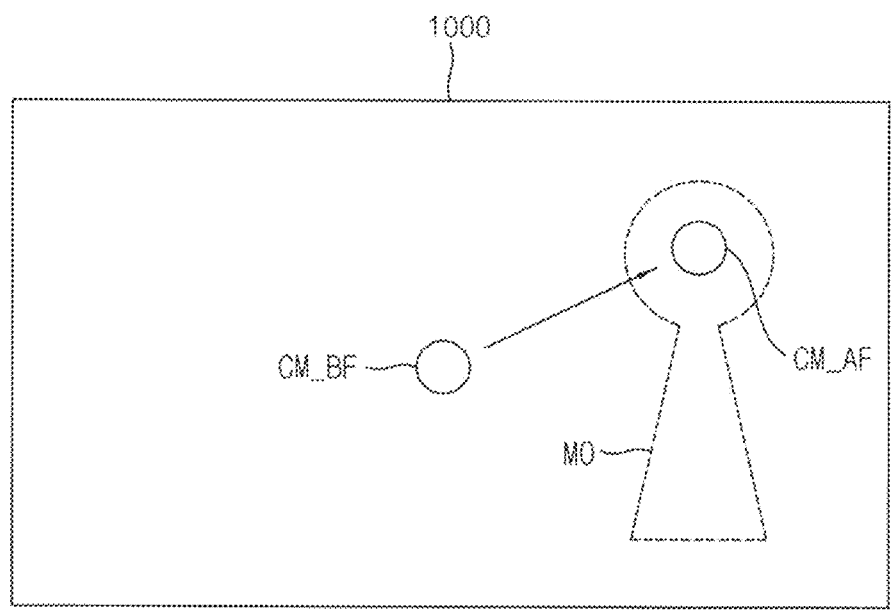
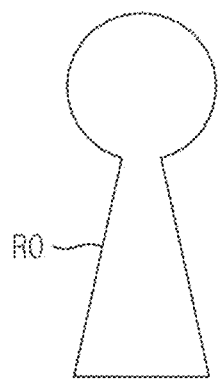

FIG. 12
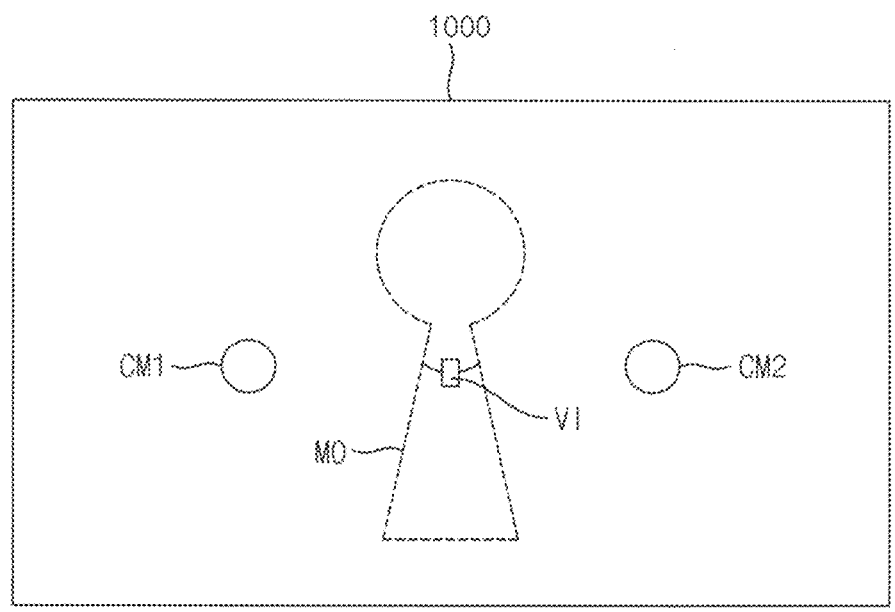
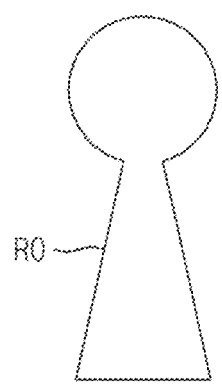

FIG. 13
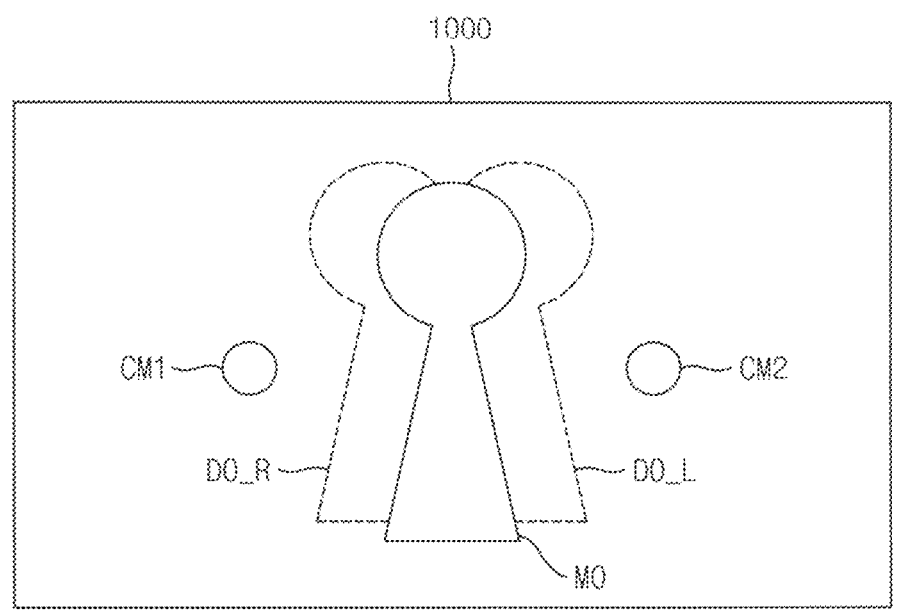
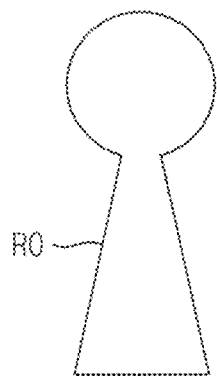

DISPLAY DEVICE

CROSS REFERENCE TO RELATED APPLICATION

This application claims priority under 35 U.S.C. § 119 to Korean patent Application No. 10-2015-0125284 filed on Sep. 4, 2015, the disclosure of which is hereby incorporated by reference herein in its entirety.

BACKGROUND

1. Technical Field

Example embodiments of the inventive concept relate to display devices. More particularly, example embodiments of the inventive concept relate to a mirror display device including a camera unit.

2. Description of the Related Art

Recently, a display device (e.g., an organic light emitting display device or a liquid crystal display device) having a mirror property together with an image display property are being developed. For example, the display device includes a mirror layer disposed on a substrate to have the mirror property.

Meanwhile, an electronic device having the display device includes a camera module that is located outside of the display device (e.g., located above the display device) to capture an image. The electronic devices use the captured images by the camera module for video call, video conference, etc. In this case, the captured images may be unnatural because the camera module can not capture the image at the front of the subject.

SUMMARY

Example embodiments provide a mirror display device embedding a camera unit.

Example embodiments provide a display device capable of clearly capturing images using an embedded camera unit.

According to some example embodiments, a display device may include a substrate, an encapsulation unit opposite to the substrate, a display unit disposed between the substrate and the encapsulation unit, the display unit including a pixel, a camera unit disposed on one side of the substrate, the camera unit including at least one camera module, and a mirror member disposed on one side of the encapsulation unit.

In example embodiments, the pixel may include a sub-pixel having an organic light emitting diode that is located in an emission region and a transparent window located in a transparent region.

In example embodiments, the mirror member may include a plurality of mirror patterns disposed on the one side of the encapsulation unit, the mirror patterns located in a mirror region, and a mirror layer disposed on the mirror patterns and the one side of the encapsulation unit, the mirror layer located in the emission region, the mirror region, and the transparent region.

In example embodiments, a reflectivity of the mirror patterns may be higher than a reflectivity of the mirror layer.

In example embodiments, the mirror pattern may include at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo).

In example embodiments, the mirror layer may include a first mirror layer including at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo) and a second mirror layer including at least one selected from the group consisting of indium tin oxide (ITO), indium zinc oxide (IZO), zinc oxide, and indium oxide.

In example embodiments, the sub-pixel may include first through third sub-pixels that emit different color lights from each other. The transparent window may be substantially collinear with one of the first through third sub-pixels.

In example embodiments, the transparent window may be substantially collinear with biggest one of the first through third sub-pixels.

In example embodiments, the sub-pixel may include first through third sub-pixels that emit different color lights from each other. The transparent window may include first through third transparent windows that are substantially collinear with the first through third sub-pixels, respectively.

In example embodiments, a ratio of a size of the transparent window to a size of the pixel may range from about 3% to about 40%.

In example embodiments, the camera unit further may include a supporting member surrounding the camera module.

In example embodiments, the camera unit further may include a moving member connected to the camera module, the moving member configured to move the camera module.

In example embodiments, the display unit may be disposed on the mirror member.

In example embodiments, the encapsulation unit may include an encapsulation layer including a first organic layer disposed on the display unit and a first inorganic layer disposed on the first organic layer.

In example embodiments, the mirror member may be disposed on the first organic layer or the first inorganic layer.

According to some example embodiments, a display device may include a display driver configured to provide a driving signal to a plurality of pixels, a substrate, an encapsulation unit opposite to the substrate, a display unit disposed between the substrate and the encapsulation unit, the display unit including the plurality of pixels, a camera unit disposed on one side of the substrate, the camera unit including at least one camera module and controlled based on a camera control signal, and a mirror member disposed on one side of the encapsulation unit.

In example embodiments, the display driver may include a scan driver configured to provide a scan signal to the plurality of pixels, a data driver configured to provide a data signal to the plurality of pixels, an emission driver configured to provide an emission control signal to the plurality of pixels, a camera driver configured to generate the camera control signal, and a controller configured to control the scan driver, the data driver, the emission driver, and the camera driver.

In example embodiments, the controller may generate a control signal for operating the plurality of pixels by a simultaneous emission driving manner in which a single frame is divided into a non-emission period in which the plurality of pixels are in a non-emission state while the data signal is supplied to the pixels, and an emission period in which the plurality of pixels are in an emission state.

In example embodiments, the camera driver may the camera control signal such that the camera unit is turned-off in the emission period.

In example embodiments, the camera driver may generate the camera control signal such that the camera unit is turned-on during the non-emission period.

In example embodiments, a period of the camera control signal may be substantially the same as a period of the single frame.

In example embodiments, the controller may generate the control signal such that the data signal is supplied to the plurality of pixels in at least a part of the non-emission period.

In example embodiments, the camera module may include first through (N)th camera modules, where N is an integer greater than 1.

In example embodiments, the controller may determine a position of a subject based on images captured by the first through (N)th camera modules and generates a control signal such that the plurality of pixels display an additional image corresponding to the position of the subject.

In example embodiments, the controller may generate the control signal such that the additional image is recognized as a three-dimensional image by displaying a left-eye image and a right-eye image captured by the first through (N)th camera modules.

In example embodiments, the controller may generate the control signal to progressively display images simultaneously captured by the first through (N)th camera modules.

In example embodiments, each of the plurality of pixels may include a sub-pixel having an organic light emitting diode that is located in an emission region, and a transparent window located in a transparent region.

In example embodiments, the mirror member may include a plurality of mirror patterns disposed on the one side of the encapsulation unit, the mirror patterns located in a mirror region, and a mirror layer disposed on the mirror patterns and the one side of the encapsulation unit, the mirror layer located in the emission region, the mirror region, and the transparent region.

Therefore, a display device according to example embodiments has a mirror property and reflects external light by including a mirror member. Accordingly, a camera unit located on a back side of a substrate does not recognized by users. The display device includes a pixel having a transparent window in order to clearly capture an image. In addition, the display device can capture a front image using the camera unit because the camera unit located on the back side of the substrate captures the image at the front of a subject.

The display device according to example embodiments drives the camera unit located on the back side of the substrate in synchronization with an operation of the pixel. The camera unit captures the image in at least a part of a non-emission period to acquire a high quality image without an effect of image displayed by pixels. In addition, the camera unit can include a plurality of camera modules. The display device determines a position of the subject and displays an additional image having various effects based on the position of the subject using the plurality of camera modules.

BRIEF DESCRIPTION OF THE DRAWINGS

Exemplary embodiments will be described more fully hereinafter with reference to the accompanying drawings, in which various embodiments are shown.

FIG. 10 is a diagram illustrating an example of an operation of a display device of FIG. 9.

FIGS. 12, 13 and 14 are diagrams illustrating examples of operations of a display device of FIG. 11.

DESCRIPTION OF EMBODIMENTS

Exemplary embodiments will be described more fully hereinafter with reference to the accompanying drawings, in which various embodiments are shown.

Figure 1:
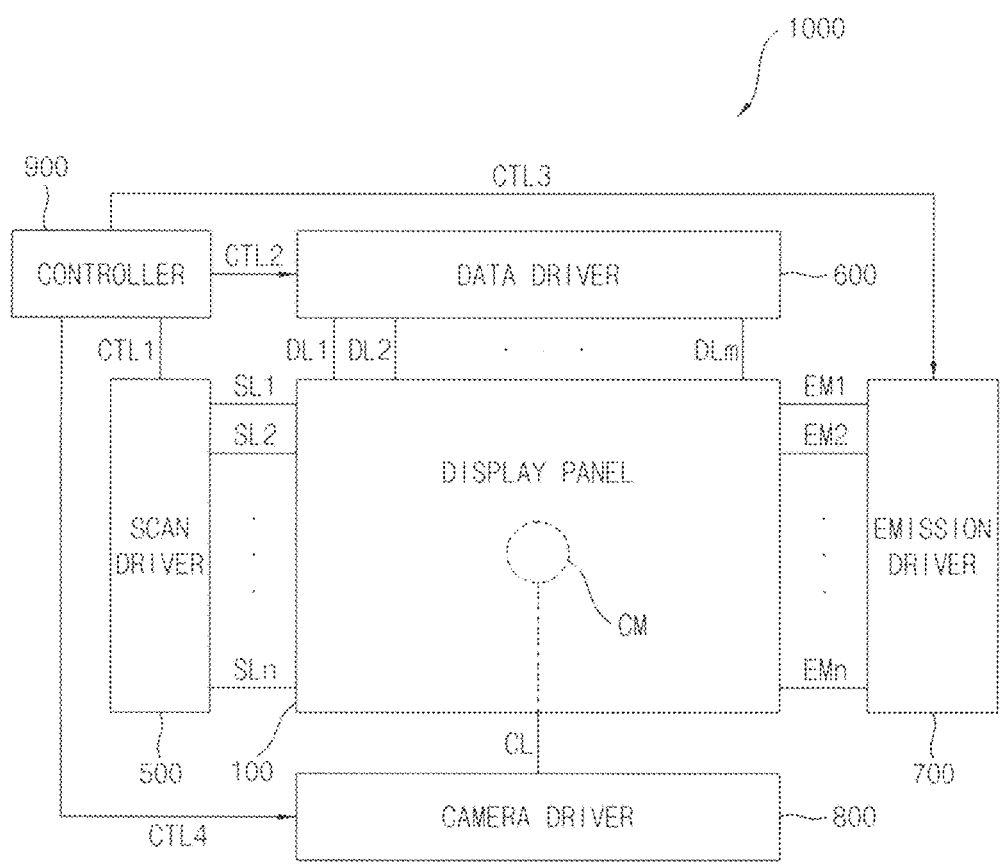
FIG. 1 is a block diagram illustrating a display device according to one example embodiment.

FIG. 1 is a block diagram illustrating a display device according to one example embodiment.

Referring to FIG. 1, the display device 1000 may include a display panel 100 and a display driver providing a driving signal to pixels. The display driver may include a scan driver 500, a data driver 600, an emission driver 700, a camera driver 800, and a controller 900.

The display device 1000 may include a substrate, an encapsulation unit, a display unit, a camera unit, and a mirror member. Here, the encapsulation unit may include an encapsulation substrate or an encapsulation layer (i.e., thin film encapsulation substrate) including organic layers and inorganic layers that are alternately laminated. In one example embodiment, the encapsulation layer may have a multi-layered structure including a first inorganic layer disposed on the display unit, a first organic layer disposed on the first inorganic layer, and a second inorganic layer disposed on the first organic layer. In one example embodiment, the mirror member is disposed on the first inorganic layer, the first organic layer, or the second inorganic layer.

The display device 1000 may have a mirror property and reflect an external light by including the mirror member disposed on one side of the encapsulation unit. Accordingly, the camera unit located on a back side of the substrate may be not recognized by users.

The display device may display an image using the pixels. In one example embodiment, each of the pixels may include a sub-pixel and a transparent window. The sub-pixels may be arranged at locations corresponding to crossing points of the scan lines SL1 through SLn and the data lines DL1 through DLm.

The display device 1000 may capture the image at the front of a subject using the camera unit. The camera unit may clearly capture the images through the transparent window located in the transparent region. The camera unit may be controlled using a camera control signal received from the camera driver 800. The camera unit may include at least one camera module CM for capturing the image. In one example embodiment, the camera module may include first through (N)th camera modules, where N is an integer greater than 1. In one example embodiment, the camera unit may further include a supporting member surrounding the camera module and a moving member connected to the camera module CM to move the camera module CM.

The scan driver 500 may provide the scan signal to the pixels via the scan lines SL1 through SLn in response to the first control signal CTL1. For example, the scan driver 500 may progressively output the scan signal to the scan lines SL1 through SLn in the scan period.

The data driver 600 may provide a data signal to the pixels via the data lines DL1 through DLm in response to the second control signal CTL2.

The emission driver 700 may provide an emission control signal to the pixels via the emission control lines EM1 through EMn in response to the third control signal CTL3. For example, the emission driver 700 may provide the emission control signal to the emission control lines EM1 through EMn to operate the pixels by a simultaneous emission driving manner. In the simultaneous emission driving manner, a single frame is divided into a non-emission period in which the pixels do not emit the light (i.e., a non-emission state) while the data signal is supplied to the pixels, and an emission period in which the pixels simultaneously emit the light (i.e., emission state).

The camera driver 800 may generate the camera control signal for controlling the camera unit in response to the fourth control signal CTL4. The camera driver 800 may provide the camera control signal to the camera unit via a camera control line CL. The camera driver 800 may control the camera unit to turn-on and turn-off the camera using the camera control signal. The camera driver 800 may generate the camera control not to be affected by the image displayed by pixels. The camera driver 800 may control the camera unit in synchronization with driving signals for driving the pixels. In one example embodiment, the camera driver 800 may generate the camera control signal such that the camera unit is turned-off during the emission period. In one example embodiment, the camera driver 800 may generate the camera control signal such that the camera unit is turned-on during at least a part of the non-emission period. In one example embodiment, a period of the camera control signal may be substantially the same as a period of the single frame. In addition, the camera driver 800 may generate the camera control signal such that the camera unit is moved to according to a target position.

The controller 900 may generate control signals CTL1 through CTL4 to control the scan driver 500, the data driver 600, the emission driver 700, and the camera driver 800. In one example embodiment, the controller 900 may generate the control signals for operating the pixels by the simultaneous emission driving manner. Here, in the single frame of the simultaneous emission driving manner, after all the data signals are progressively provided to the pixels, and all pixels simultaneously emit the light corresponding to the data signal. The single frame of the simultaneous emission driving manner includes the non-emission period in which the pixels do not emit the light and the emission period in which the pixels simultaneously emit the light.

The controller 900 may generate an additional image having various effects using images captured by the plurality of camera modules CM and generate the control signals to display the additional images. In one example embodiment, the controller 900 may determine a position of the subject based on the images captured by the first through (N)th camera modules and generate the control signals to display the additional image corresponding to the position of the subject. For example, the controller 900 may generate the control signals such that the additional image is recognized as a three-dimensional image by displaying a left-eye image and a right-eye image captured by the first through (N)th camera modules. In one example embodiment, the controller 900 may generate the additional image as a time slice manner. For example, the controller 900 may generate the control signal to progressively display images that are simultaneously captured by the first through (N)th camera modules.

The display device 1000 can have a mirror property including a mirror member. The mirror display device can capture an image in front of the display device using the camera unit because the camera unit is located on the back of the substrate. In addition, the display device 1000 may control the camera unit located on the back side of the substrate in synchronization with the operation of the pixels. Accordingly, the display device 1000 can acquire high quality image without deteriorating the image because the camera unit captures the images only during a non-emission period.

Figure 2:
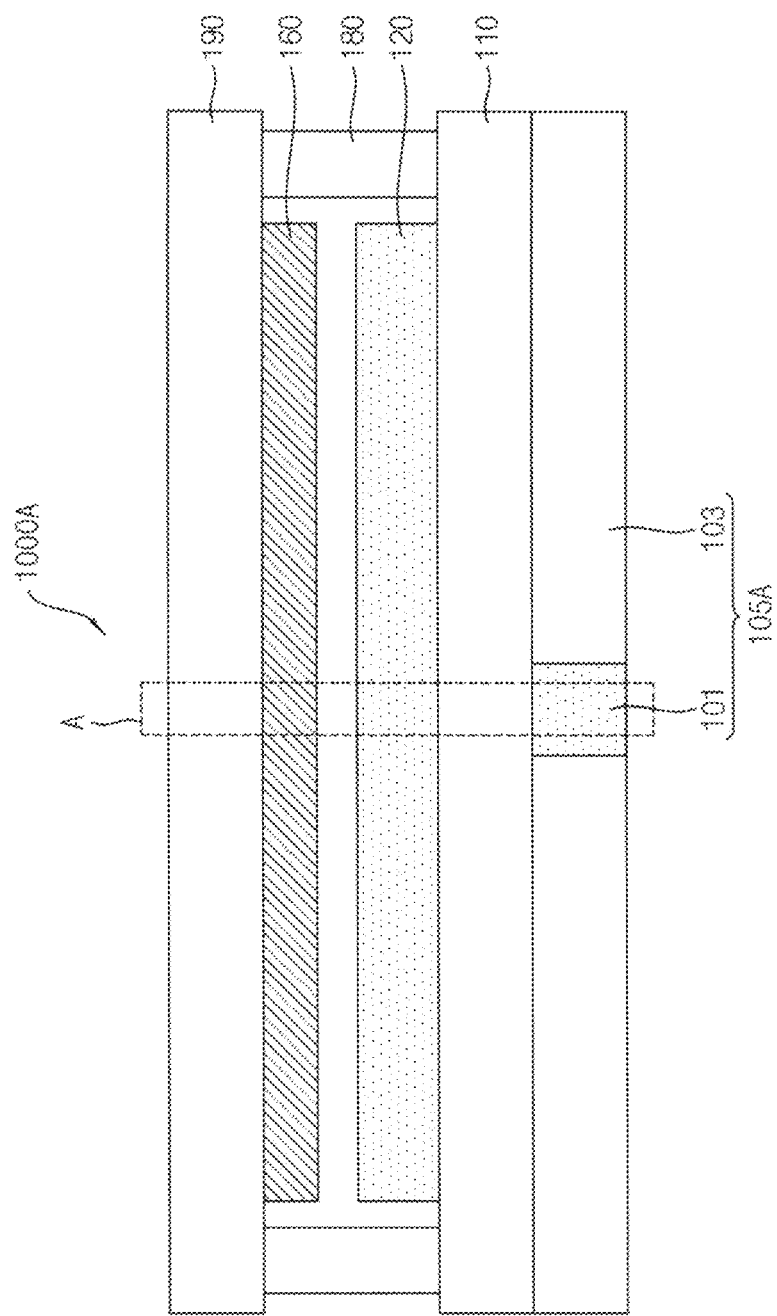
FIG. 2 is a cross-sectional view illustrating one example of a display device of FIG. 1.
Figure 3:
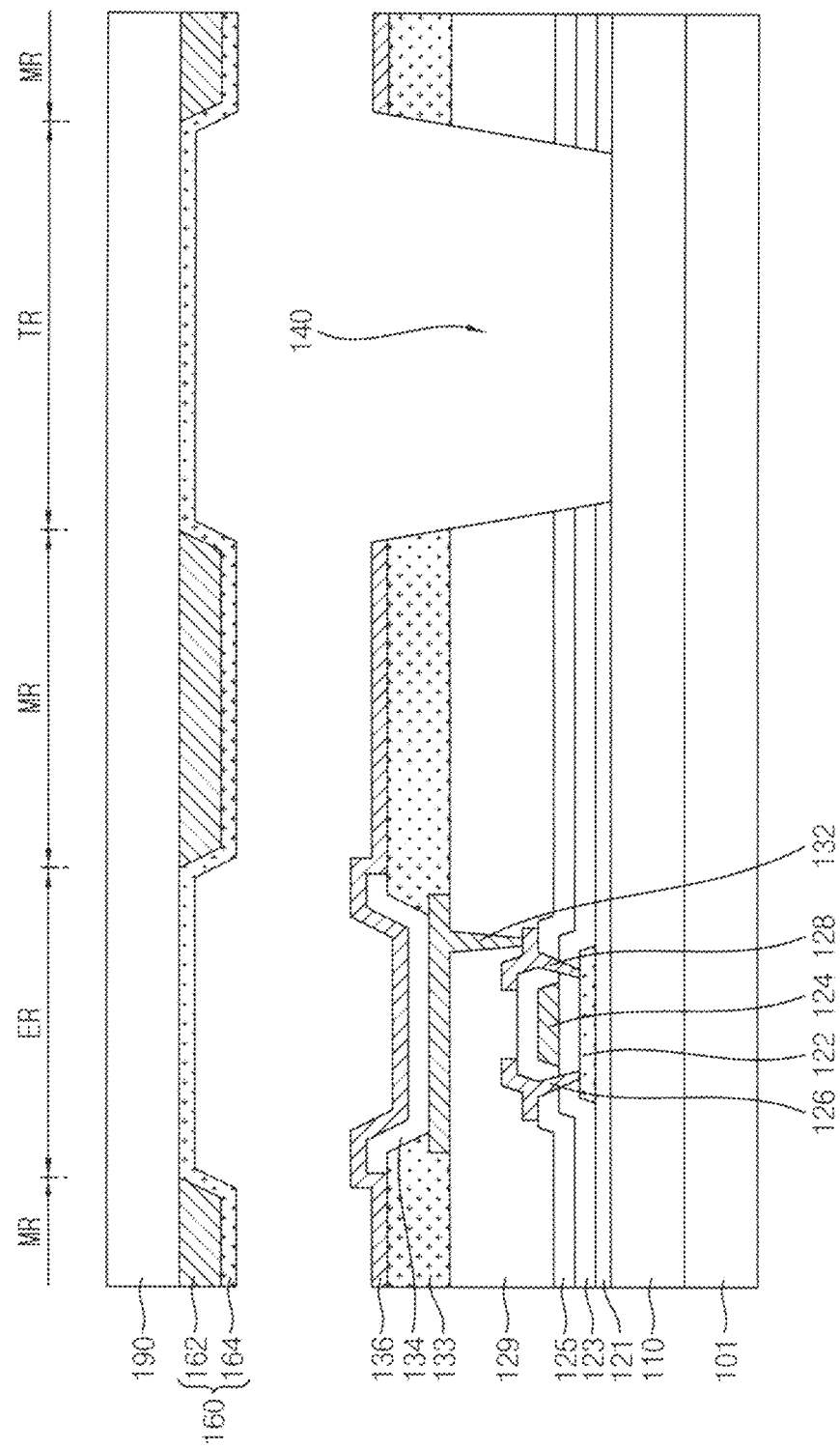
FIG. 3 is an enlarged view illustrating an example of a portion 'A' of FIG. 2.

FIG. 2 is a cross-sectional view illustrating one example of a display device of FIG. 1. FIG. 3 is an enlarged view illustrating an example of a portion 'A' of FIG. 2.

Referring to FIGS. 2 and 3, the display device 1000A may include a camera unit 105A, a first substrate 110, a display unit 120, a mirror member 160, and a second substrate 190.

The first substrate 110 and the second substrate 190 may include a glass substrate or a transparent plastic substrate. The second substrate 190 may be opposite to the first substrate 110. A barrier layer 121 may be formed on the first substrate 110. Moistures penetrating through the first substrate 110 may be blocked by the barrier layer 121, and impurity diffusion between the first substrate 110 and structures disposed thereon may be also blocked by the barrier layer 121. For example, the barrier layer 121 may include silicon oxide, silicon nitride, or silicon oxynitride. These may be used alone or in a combination thereof. In an embodiment, the barrier layer 121 may have a multi-layered structure including a silicon oxide layer and a silicon nitride layer.

The display unit 120 may be disposed on the first substrate 110 on the barrier layer 121 and have a top emission type structure. The display unit 120 may include a pixel having a sub-pixel and a transparent window 140. The sub-pixel may include a switching element and an organic light emitting display diode electrically connected to the switching element.

The switching element may include a thin film transistor (TFT) including an active pattern 122, a gate insulation layer 123, a gate electrode 124, a source electrode 126, and a drain electrode 128.

The active pattern 122 may include a silicon compound such as polysilicon. Also, the active pattern 122 may include an oxide semiconductor such as indium gallium zinc oxide (IGZO), zinc tin oxide (ZTO), or indium tin zinc oxide (ITZO). For example, an active layer including the silicon compound or the oxide semiconductor may be formed by a sputtering process, and then may be patterned by a photo-lithography process.

The gate insulation layer 123 may be formed on the barrier layer 121 to cover the active pattern 122. For example, the gate insulation layer 123 may include silicon oxide, silicon nitride and/or silicon oxynitride. The gate insulation layer 123 may have a multi-layered structure including a silicon oxide layer and a silicon nitride layer.

The gate electrode 124 may be formed on the gate insulation layer 123, and may be overlap the active pattern 122. For example, a first conductive layer may be formed on the gate insulation layer 123, and may be patterned by a photo-lithography process to form the gate electrode 124. The first conductive layer may be formed of a metal such as Al, Ag, W, Cu, Mo, Ti, Ta, Cr, etc., or a nitride thereof by a sputtering process or an ALD process. The first conductive layer may be formed as a multi-layered structure such as an Al/Mo structure or a Ti/Cu structure.

An insulating interlayer 125 may be formed on the gate insulation layer 123, and may cover the gate electrode 124. The insulating interlayer 125 may include silicon oxide, silicon nitride and/or silicon oxynitride. The insulating interlayer 125 may have a multi-layered structure including a silicon oxide layer and a silicon nitride layer.

The source electrode 126 and the drain electrode 128 may extend through the insulating interlayer 125 and the gate insulation layer 123 to be in contact with the active pattern 122. For example, the source electrode 126 and the drain electrode 128 may be in contact with the source region and the drain region, respectively, of the active pattern 122.

For example, the insulating interlayer 125 and the gate insulation layer 123 may be partially etched to form contact holes through which the active pattern 122 may be exposed. A second conductive layer filling the contact holes may be formed on the insulating interlayer 125, and may be patterned by a photo-lithography process to form the source electrode 126 and the drain electrode 128. The second conductive layer may be formed from a material and a process substantially the same as or similar to those for the first conductive layer.

A via insulation layer 129 may be formed on the insulating interlayer 125, and may cover the source and drain electrodes 126 and 128. For example, the via insulation layer 129 may be formed using an organic material such as polyimide, an epoxy resin, an acrylate-based resin, or polyester by a spin coating process or a slit coating process. The via insulation layer 129 may also serve as a planarization layer of the display unit 120.

The organic light emitting diode may be formed on the via insulation layer 129. The organic light emitting diode may include a first electrode 132, a display layer 134, and a second electrode 136. The organic light emitting diode may be located in the emission region ER.

The first electrode 132 may extend through the via insulation layer 129, and may be electrically connected to the drain electrode 128. For example, the via insulation layer 129 may be partially removed to form a via hole through which the drain electrode 128 may be exposed. A third conductive layer sufficiently filling the via hole may be formed on the via insulation layer, and may be patterned by a photo-lithography process to form the first electrode 132. The first electrode 132 may serve as an anode of the organic light emitting diode, and may be formed for each of the sub-pixels included in the display unit 120.

The third conductive layer may be formed from a material and a process substantially the same as or similar to those for the first conductive layer. The third conductive layer may be formed of a transparent conductive layer such as indium tin oxide (ITO), indium zinc oxide (IZO), zinc oxide, indium oxide, etc.

A pixel defining layer 133 may be formed on the via insulation layer 129 to cover a peripheral portion of the first electrode 132. For example, the pixel defining layer 133 may be formed using a photosensitive organic material by coating, exposure and developing processes. Alternatively, the pixel defining layer 133 may be formed of a silicon-based inorganic material by a photo-lithography process.

The display layer 134 may be formed on the first electrode 132 and the pixel defining layer 133. In this case, a hole transport layer (HTL) and an electron transport layer (ETL) may be further formed under the display layer 134 and on the display layer 134, respectively. The display layer 134 may be formed by individually printing the organic light emitting material at the each pixel. The HTL and the ETL may be formed at the each pixel, or may be formed commonly at a plurality of the pixels.

The second electrode 136 may be formed on the pixel defining layer 133 and the display layer 134. In one example embodiment, the second electrode 136 may serve as a cathode of the organic light emitting diode. The second electrode 136 may be formed by a depositing a metal or a transparent conductive material as mentioned above.

The display unit 120 may have a transparent window 140 in the transparent region TR. In one example embodiment, the transparent window 140 may be formed by removing or not forming the second electrode 136, the pixel defining layer 133, the via insulation layer 129, the insulating interlayer 125, the gate insulation layer 123, and the barrier layer 121 in the transparent region TR. In one example embodiment, every pixels included in the display unit 120 may include the transparent window 140. In another example embodiment, the pixels overlapping the camera module 101 among the entire pixels may include the transparent window 140.

The mirror member 160 may be disposed on one side of the second substrate 190 (i.e., encapsulation unit). The mirror member 160 may reflect an external light in order that the display device has the mirror property and the camera unit 105A located on the back side of the substrate does not recognized by users. The mirror member 160 may include a plurality of mirror patterns 162 and a mirror layer 164.

The mirror patterns 162 may be disposed on one side of the second substrate 190 and may be located in the mirror region MR. In one example embodiment, the mirror pattern 162 may include at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo).

The mirror layer 164 may be disposed on the mirror patterns 162 and the one side of the second substrate 190 and may be located in the emission region ER, the mirror region MR, and the transparent region TR. The mirror layer 164 may have a multi-layered structure. In one example embodiment, the mirror layer 164 may include a first mirror layer and a second mirror layer. The first mirror layer may include at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo). The second mirror layer may include at least one selected from the group consisting of indium tin oxide (ITO), indium zinc oxide (IZO), zinc oxide, and indium oxide. The second mirror layer may serve as a protection layer.

In one example embodiment, a reflectivity of the mirror patterns 162 may be higher than a reflectivity of the mirror layer 164. The mirror patterns 162 may be located in the mirror region MR only and may have relatively high reflectivity, thereby increasing the reflectance of the mirror region MR and improving the mirror property. Also, because the mirror layer 164 is located in entire region (i.e., the emission region ER, the mirror region MR, and the transparent region TR) of the pixels and has relatively low reflectivity, an image displayed by the display unit 120 may be transmitted to the outside of the display device in the emission region ER and the camera unit 105A may capture an image through the transparent region TR.

The camera unit 105A may be disposed on one side of the first substrate 110. The camera unit 105A may include a camera module 101 to capture the image. The camera module 101 may capture the image through the transparent window 140 of the display unit 120. The camera module 101 may overlap a plurality of pixels. For example, the camera module 101 may have a size of 5×5 mm and overlap 5 by 5 pixel matrix. In one example embodiment, the camera unit 105A may further include a supporting member 103 surrounding the camera module 101. The supporting member 103 may surround the camera module 101 to support the camera module 101 and prevent separation of the camera module 101 from the first substrate 110. Also, the supporting member 103 may include a heat sink plate discharging the heat generated by the display device 120.

In addition, the display device 1000A may include a sealing member 180 encapsulating the display unit 120 and disposed between the first substrate 110 and the second substrate 190. The sealing member 180 may include various materials capable of absorbing or blocking external atmosphere and/or moisture. For example, the sealing member 180 may include an adhesive material such as a silicone-based material, an epoxy-based material, or the like.

Therefore, the display device 1000A may capture the image at the front of the display device by using the embedded camera unit 105A. If the camera module is located outside of the display device, for example, on the top of the display device, unlike the present inventive concept, the image captured by the camera module may be unnatural because the camera module can not capture the image at the front of the subject. On the other hand, if the camera module is embedded in the display device like the present inventive concept, the display device can capture the image at the front of a subject to acquire natural images.

Although the example embodiments of the FIG. 3 describe that the transparent window 140 is formed by removing or not forming the second electrode 136, the pixel defining layer 133, the via insulation layer 129, the insulating interlayer 125, the gate insulation layer 123, and the barrier layer 121 in the transparent region TR, it is not limited thereto. For example, the transparent window may be formed by removing or not forming the second electrode in the transparent region or by removing or not forming the pixel defining layer and the via insulation layer in the transparent region.

Although the example embodiments of the FIG. 3 describe that the display device does not include color filters, the display device can include the color filters. For example, the display device may include white organic light emitting diode (WOLED) pixels in which the organic light emitting materials, for example, a red organic light emitting material, a green organic light emitting material and a blue organic light emitting material, are commonly formed and the color is implemented by the color filter.

Although the example embodiments of the FIG. 3 describe that the mirror member 160 is disposed on one side of the second substrate 190, for example, on a side opposing the first substrate 110, it is not limited thereto. For example, the mirror member may be disposed on the second electrode on the first substrate 110.

Although the example embodiments of the FIG. 3 describe that the mirror member 164 and the mirror patterns 162 are disposed on one side of the second substrate 190, it is not limited thereto. For example, the mirror layer is disposed on the first side of the second substrate and the mirror patterns are disposed on the second side of the second substrate.

Although the example embodiments of the FIG. 3 describe that the encapsulation unit includes the second substrate 190 and the sealing member 180, the encapsulation unit can include laminated encapsulation layers (i.e., thin-film encapsulation layer) having a multi-layered structure including inorganic layers and organic layers that are alternately stacked. In this case, the mirror member may be disposed on various locations of multi-layered structure. In one example embodiment, the first inorganic layer, the first organic layer, the second inorganic layer, and the mirror member may be sequentially disposed on the display unit. In another example embodiment, the first inorganic layer, the mirror member, the first organic layer, and the second inorganic layer, may be sequentially disposed on the display unit. In still another example embodiment, the first inorganic layer, the first organic layer, the mirror member, and the second inorganic layer may be sequentially disposed on the display unit.

Figure 4:
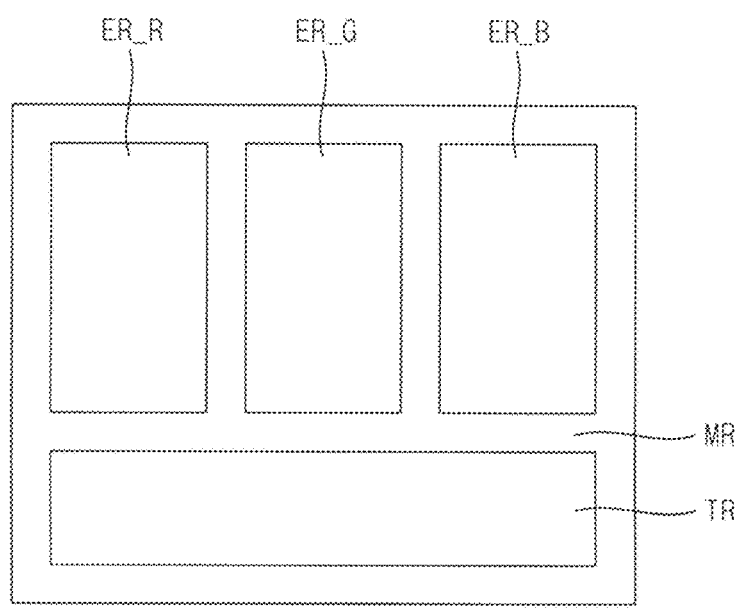
FIG. 4 is a plan view illustrating an example of a pixel included in a display device of FIG. 2.

FIG. 4 is a plan view illustrating an example of a pixel included in a display device of FIG. 2.

Referring to FIG. 4, the pixel may be divided into first through third emission regions ER_R, ER_G, and ER_B, a mirror region MR, and a transparent region TR.

Organic light emitting diodes of first through third sub-pixel may be located in the first through third emission regions ER_R, ER_G, and ER_B, respectively. The organic light emitting diodes of the first through third sub-pixel may emit red color light, green color light, and blue color light, respectively. A mirror member may include a mirror layer of which reflectivity is relatively low in the first through third emission regions ER_R, ER_G, and ER_B. Therefore, the image displayed by the first through third sub-pixels may be transmitted through the mirror layer and may be recognized by a user.

The mirror member may include mirror patterns in the mirror region MR and the mirror layer covering substantially all the regions including the emission region ER, the mirror region MR and the transparent region TR. Because the mirror patterns have a relatively high reflectivity, the mirror member may have a relatively high reflectance in the mirror region MR.

A transparent window may be located in the transparent region TR. The mirror member may include the mirror layer of which reflectivity is relatively low in the transparent region TR. External light may be transmitted through the transparent window located in the transparent region TR. The camera module can clearly capture the image through the transparent window. A ratio of a size of the transparent window to a size of the pixel may be determined in consideration of a quality of the captured image.

Figure 5:
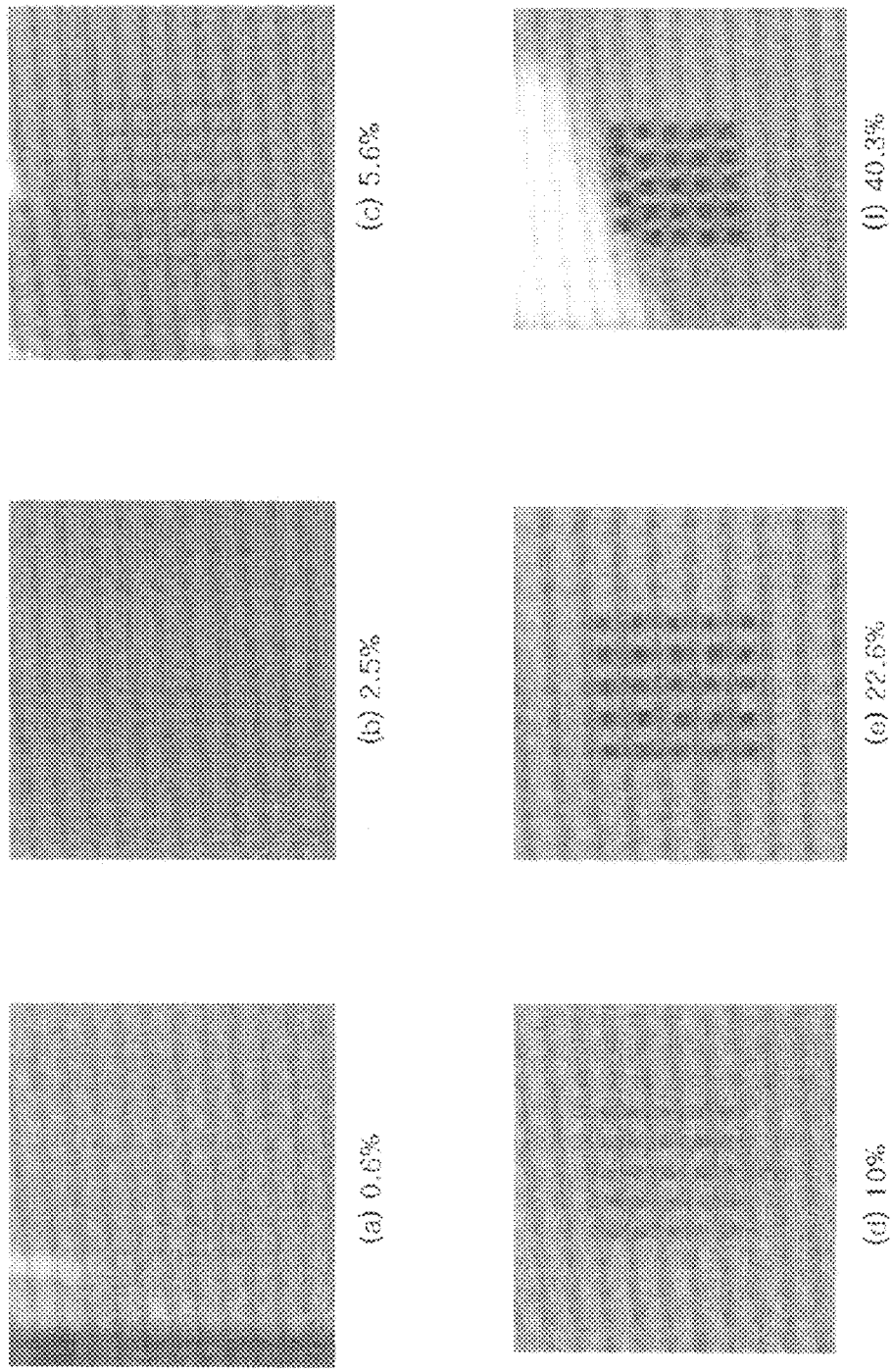
FIGS. 5 and 6 are diagrams for describing a quality of a captured image according to a ratio of a size of a transparent window to a size of a pixel.
Figure 6:
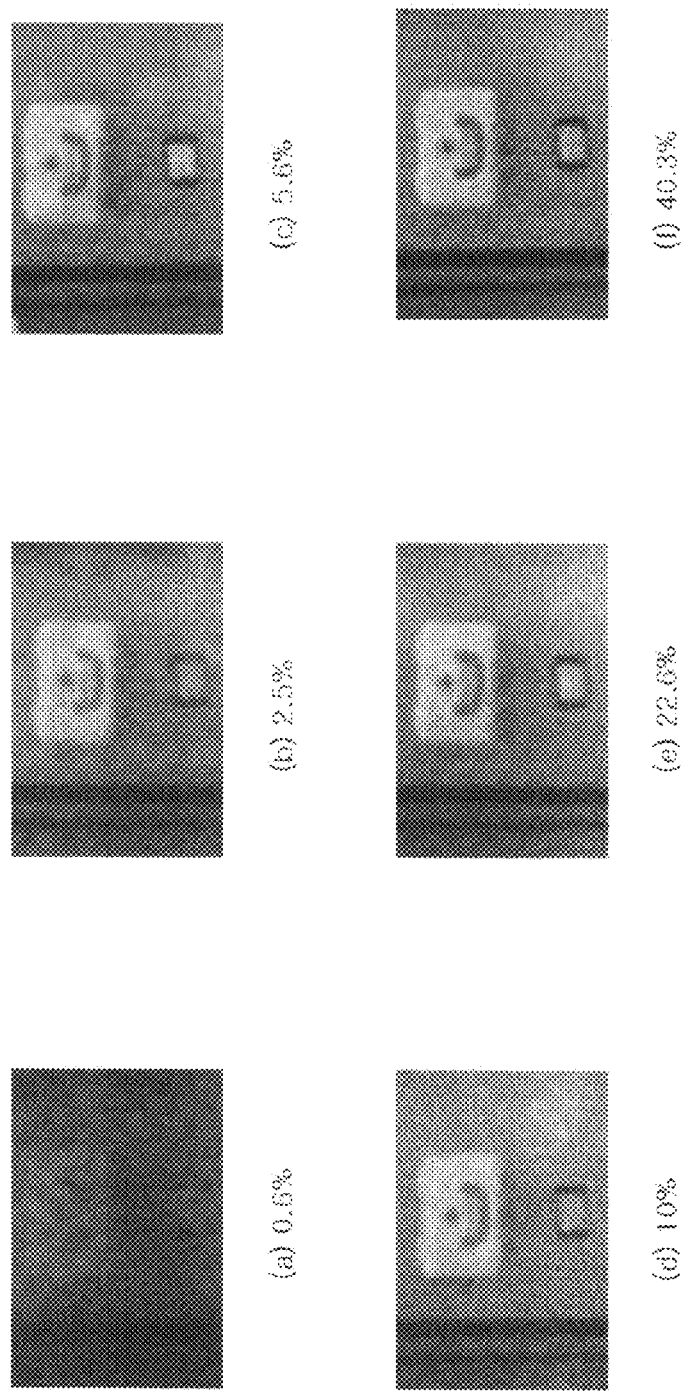

FIGS. 5 and 6 are diagrams for describing a quality of a captured image according to a ratio of a size of a transparent window to a size of a pixel.

Referring to FIGS. 5 and 6, brightness and visibility of a captured image may be changed according to a ratio of a size of a transparent window to a size of a pixel. Therefore, the ratio of the size of the transparent window may be determined in consideration of the quality of the captured image.

As shown in FIG. 5, in the captured image, cross stripes may be recognized as the ratio of the size of the transparent window to the size of the pixel increase. When the sub-pixels are arranged in a stripe structure, the sub-pixels may be recognized as the cross stripes due to transparent windows in the transparent region. In this case, the cross stripes clearly appear in the captured image as the size of the transparent window increases. For example, when the ratio of the size of the transparent window to the size of the pixel is 0.6%, the cross stripes may be not recognized because the size of the transparent window is relatively small and the sub-pixels are not distinctly divided by the transparent window. On the other hand, when the ratio of the size of the transparent window to the size of the pixel is 40.3%, the cross stripes may be strongly recognized because the size of the transparent window is relatively large and the sub-pixels are distinctly divided by the transparent window.

As shown in FIG. 6, the brightness of the captured image may increase as the ratio of the size of the transparent window to the size of the pixel increases. Because, the camera module is exposed to the external light through the transparent window, the camera module can capture bright image as the size of the transparent window increases.

For example, when the ratio of the size of the transparent window to the size of the pixel is 0.6%, the captured image is relatively dark because the size of the transparent window is relatively small and the external light is not sufficiently transmitted through the transparent window. On the other hand, when the ratio of the size of the transparent window to the size of the pixel is 40.3%, the captured image is relatively bright because the size of the transparent window is relatively large and the external light is sufficiently transmitted through the transparent window.

Therefore, the ratio of the size of the transparent window to the size of the pixel may be determined in consideration of the brightness and visibility of the cross stripes of the captured image. In one example embodiment, the ratio of the size of the transparent window to the size of the pixel may range from about 3% to about 40%. When the ratio of the size of the transparent window ranges from about 3% to about 40%, the captured image may is relatively bright and the cross stripes do not specifically recognized.

Figure 7:
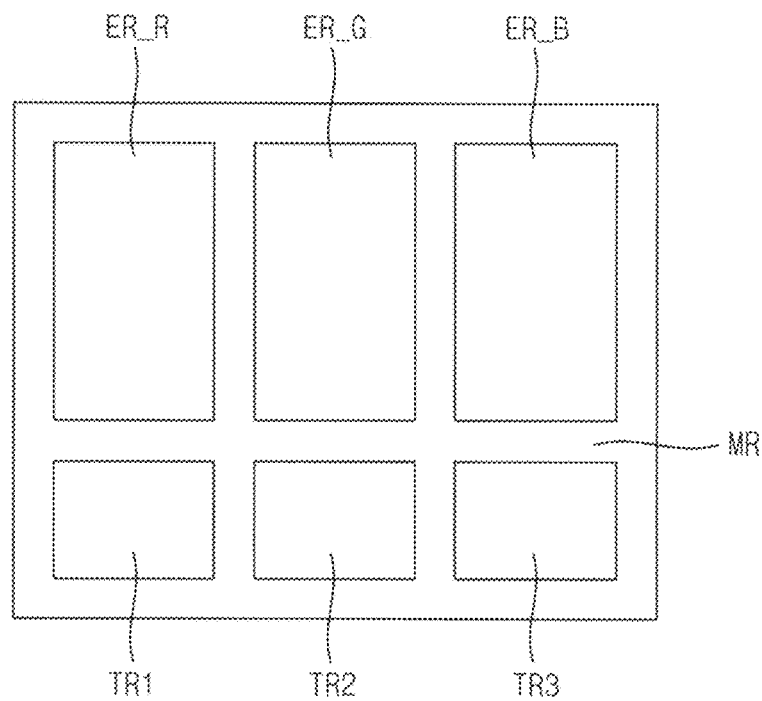
FIGS. 7 and 8 are plan views illustrating examples of a pixel included in a display device of FIG. 2.
Figure 8:
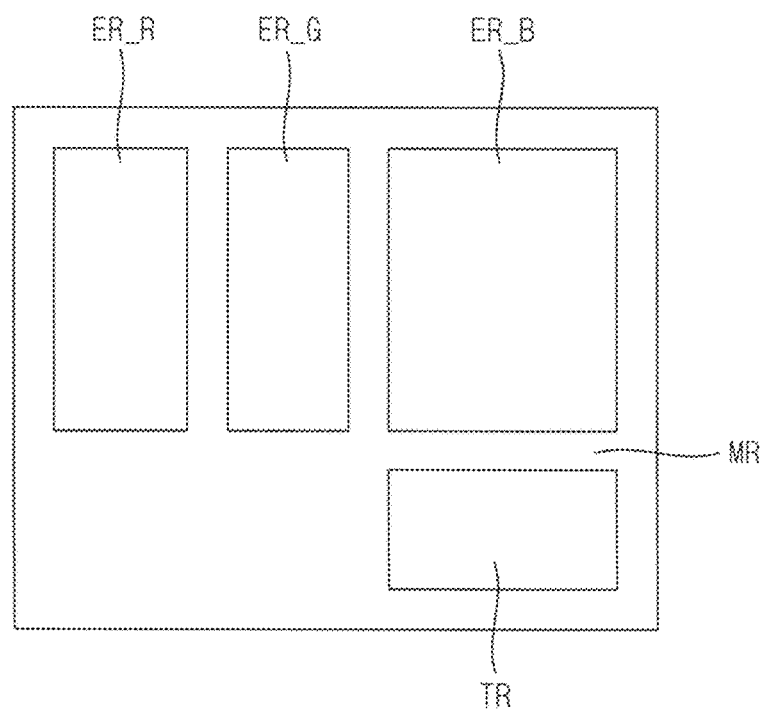

FIGS. 7 and 8 are plan views illustrating examples of a pixel included in a display device of FIG. 2.

Referring to FIGS. 7 and 8, a transparent region may be arranged in various configurations in consideration of a diffraction of the external light and a position of adjacent organic light emitting diode. The pixel according to the present exemplary embodiment is substantially the same as the pixel of the exemplary embodiment described in FIG. 4, except the arrangement of the transparent region. Therefore, the same reference numerals will be used to refer to the same or like parts as those described in the previous exemplary embodiment of FIG. 4, and any repetitive explanation concerning the above elements will be omitted.

As shown in FIG. 7, the pixel may be divided into first through third emission regions ER_R, ER_G, and ER_B, a mirror region MR, and first through third transparent region TR1, TR2, and TR3.

The first through third transparent windows may be located in the first through third transparent region TR1, TR2, and TR3. In this case, the first through third transparent windows may be substantially collinear with the first through third sub-pixels, respectively. When single pixel includes the first through third transparent windows, the camera module may clearly capture the image because of a light diffraction phenomenon.

As shown in FIG. 8, the pixel may be divided into first through third emission regions ER_R, ER_G, and ER_B, a mirror region MR, and a transparent region TR.

The transparent windows may be located in the transparent region TR. The transparent window may be substantially collinear with one of the first through third sub-pixels. In one example embodiment, the transparent window may be substantially collinear with biggest one of the first through third sub-pixels. For example, the organic light emitting diodes of the first through third sub-pixels may emit red color light, green color light, and blue color light, respectively. The third sub-pixel emitting the blue color light may be the biggest one and the transparent window may be substantially collinear with the third sub-pixel. In this case, the camera module may capture the image having a uniform color in general because the camera module is largely affected by the third sub-pixel emitting the blue color light adjacent to the transparent windows.

Figure 9:
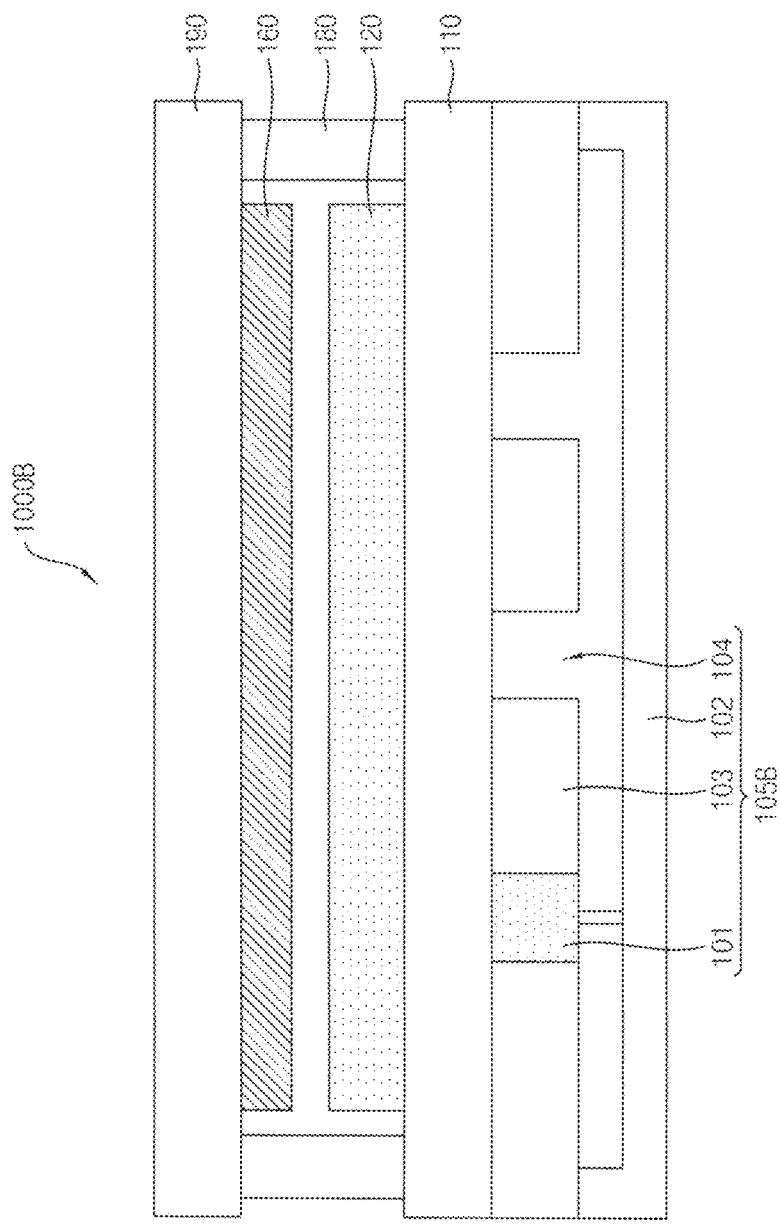
FIG. 9 is a cross-sectional view illustrating another example of a display device of FIG. 1.

FIG. 9 is a cross-sectional view illustrating another example of a display device of FIG. 1.

Referring to FIG. 9, the display device 1000B may include a camera unit 105B, a first substrate 110, a display unit 120, a mirror member 160, and a second substrate 190. The display device 1000B according to the present exemplary embodiment is substantially the same as the display device of the exemplary embodiment described in FIG. 2, except a structure of the camera unit. Therefore, the same reference numerals will be used to refer to the same or like parts as those described in the previous exemplary embodiment of FIG. 2, and any repetitive explanation concerning the above elements will be omitted.

The first substrate 110 and the second substrate 190 may include a glass substrate or a transparent plastic substrate.

The display unit 120 may be disposed on the first side (e.g., upper side) of the first substrate 110 and include a pixel having a sub-pixel and a transparent window.

The mirror member 160 may be disposed on one side of the second substrate 190. The mirror member 160 may reflect external light in order that the display device has the mirror property and the camera unit 105B located on the first side of the first substrate 110 does not recognized by users.

The camera unit 105B may be disposed on the second side (e.g., lower side) of the first substrate 110. The camera unit 105B may include a camera module 101, a moving member 102, and a supporting member 103.

The camera module 101 may capture the image through the transparent window of the display unit 120. The supporting member 103 may surround the camera module 101 and may support the camera module 101 to prevent the camera module 101 from separating from the first substrate 110. The supporting member 103 may have one or more openings 104 in which the camera module 101 is seated. Also, the supporting member 103 may include a heat sink plate cooling the heat generated by the display device 120.

The moving member 102 may be connected to the camera module to move the camera module 101. For example, the moving member 102 may move the camera module 101 to one of the openings 104 according to the location of the object to be taken images.

FIG. 10 is a diagram illustrating an example of an operation of a display device of FIG. 9.

Referring to FIG. 10, the display device 1000 may move the camera module according to a position of a subject. For example, when the user RO is located on the right side of the display device 1000, the display device 1000 may determine the position of the user RO using a captured image by the camera unit or a position recognition sensor that senses a position of the user. The camera unit may move the camera module from a first position CM_BF to a second position CM_AF according to the position of the user RO using the moving member. Therefore, the camera module may capture the image at the front of the subject and the display device 1000 can perform a variety of functions based on the captured images.

Figure 11:
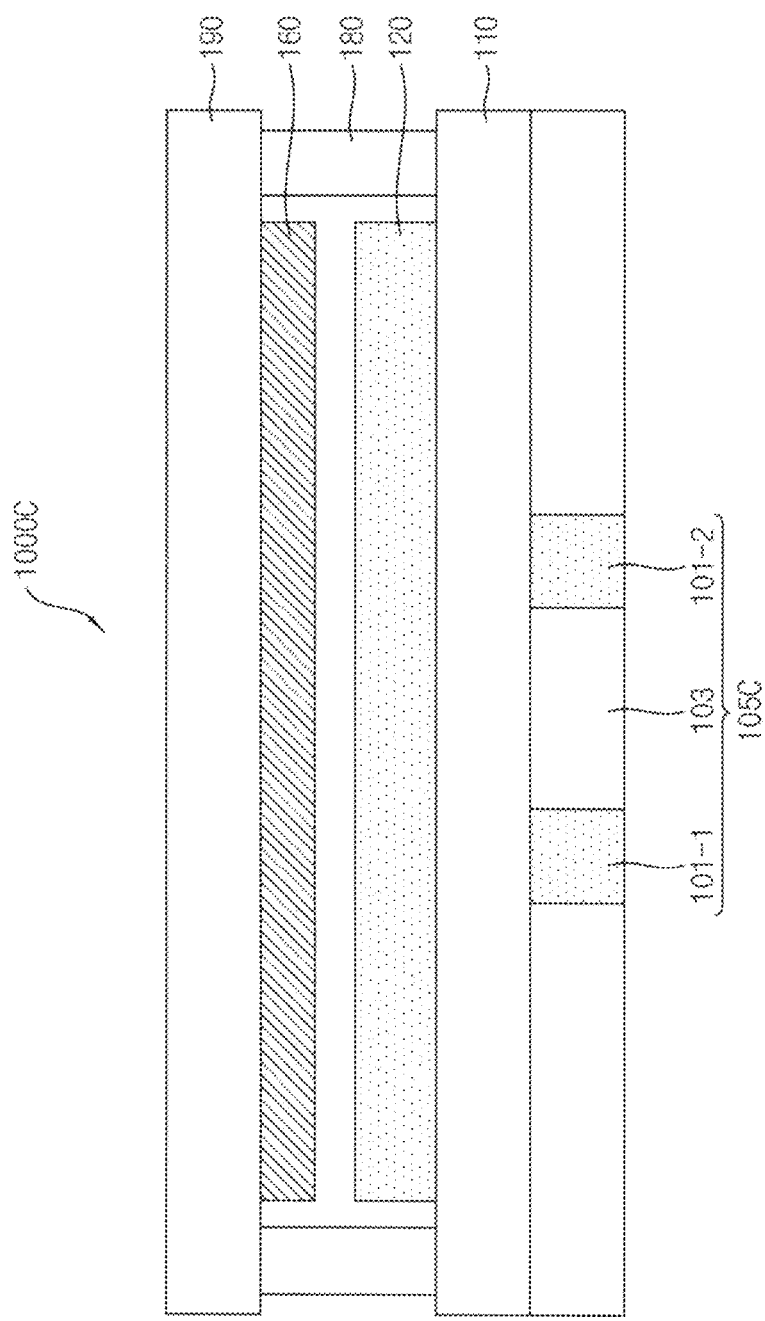
FIG. 11 is a cross-sectional view illustrating still another example of a display device of FIG. 1.

FIG. 11 is a cross-sectional view illustrating still another example of a display device of FIG. 1.

Referring to FIG. 11, the display device 1000C may include a camera unit 105C, a first substrate 110, a display unit 120, a mirror member 160, and a second substrate 190. The display device 1000C according to the present exemplary embodiment is substantially the same as the display device of the exemplary embodiment described in FIG. 2, except a structure of the camera unit 150C. Therefore, the same reference numerals will be used to refer to the same or like parts as those described in the previous exemplary embodiment of FIG. 2, and any repetitive explanation concerning the above elements will be omitted.

The first substrate 110 and the second substrate 190 may include a glass substrate or a transparent plastic substrate.

The display unit 120 may be disposed on the first substrate 110 and may include a pixel having a sub-pixel and a transparent window.

The mirror member 160 may be disposed on one side of the second substrate 190. The mirror member 160 may reflect external light in order that the display device has the mirror property and the camera unit 105C located on the back side of the first substrate 110 does not recognized by users.

The camera unit 105C may be disposed on one side of the first substrate 110. The camera unit 105C may include a plurality of camera modules 101-1 and 101-2, and a supporting member 103.

Each of the camera modules 101-1 and 101-2 may capture the image through the transparent window of the display unit 120. In one example embodiment, a position of a subject may be determined based on images captured by the first camera module 101-1 and the second camera module 101-2. An additional image corresponding to the position of the subject may be generated. In one example embodiment, the first camera module 101-1 may capture a right-eye image and the second camera module 101-2 may capture a left-eye image. A three-dimensional image is generated as the additional image based on the right-eye image and the left-eye image. In one example embodiment, a first focus depth of the first camera module 101-1 may be different from a second focus depth of the second camera module 101-2 to generate a depth map, and then image processing (e.g., three-dimensional scanning, scaling, background removal, position recognition, gesture recognition, etc) for the captured image can be performed using the depth map.

The supporting member 103 may surround the camera module 101 to support the camera module 101 and prevent to separate the camera module 101 from the first substrate 110. Also, the supporting member 103 may include a heat sink plate cooling the heat generated by the display device 120.

Figure 14:
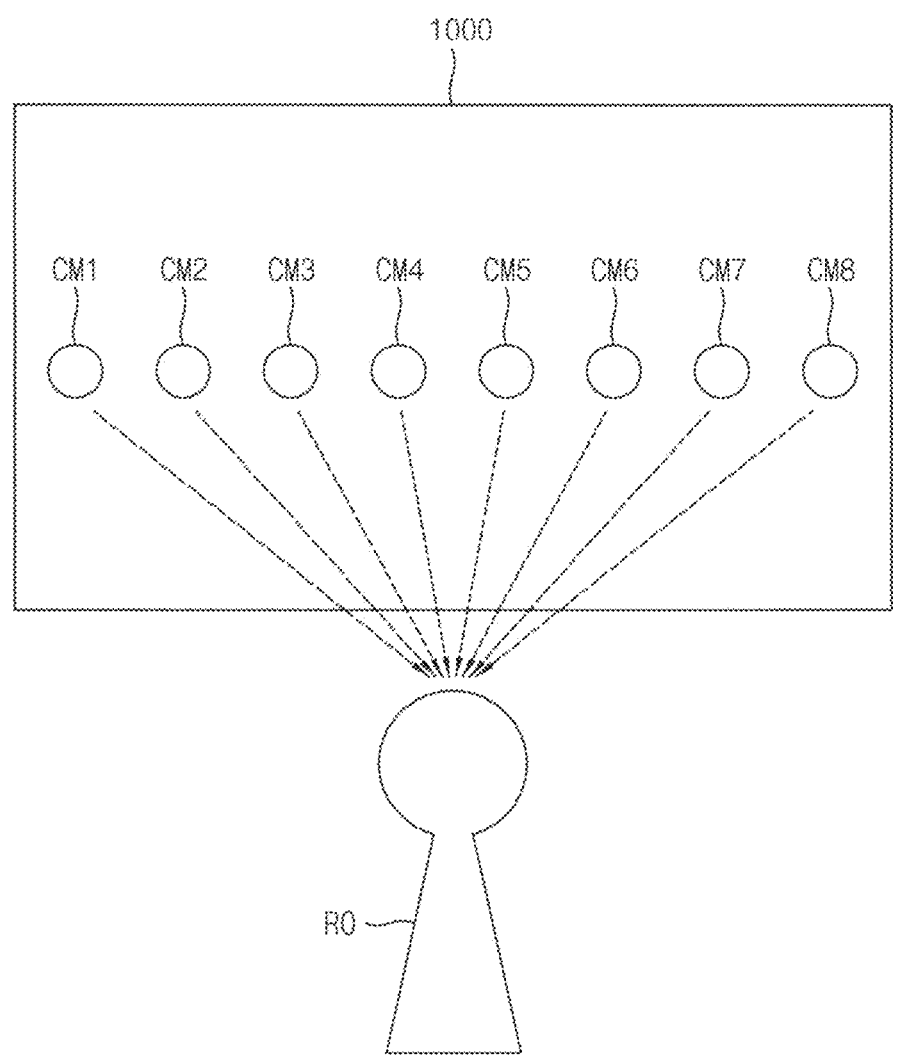

FIGS. 12 through 14 are diagrams illustrating examples of operations of a display device of FIG. 11.

Referring to FIGS. 12 through 14, the display device 1000 may generate and display additional images having various effects by including a plurality of camera modules.

As shown in FIG. 12, the display device 1000 may determine a position of a subject using the camera modules, and then the additional image corresponding to the position of the subject can be displayed.

For example, when the user RO is located on the front of the display device 1000, the user RO can see the reflection of the user MO by the mirror property of the display device 1000. The first camera module CM1 and the second camera module CM2 may capture the images to determine the position of the user. The display device 1000 may generate and display a virtual necklace image VI corresponding to the position of the user as the additional image. Therefore, the user RO can see the virtual necklace image VI (i.e., additional image) with the reflection of the user MO.

As shown in FIG. 13, the display device 1000 may generate a three-dimensional image using the camera modules, and then the additional image corresponding to the position of the subject can be displayed.

The first camera module CM1 may capture the right-eye image and the second camera module CM2 may capture the left-eye image. The display device 1000 may generate the three-dimensional image using the captured left-eye image and right-eye image. The display device 1000 may display the generated three-dimensional image in various methods based on the position of the user. The display device 1000 can display the three-dimensional image by a glasses type using three-dimensional glasses or a non-glasses type not using the three-dimensional glasses. In one example embodiment, the display device 1000 may display the three-dimensional image by a polarization filter type among the glasses type. The polarization filter type divides the left-eye image and right-eye image using an obscuration effect by a combination of orthogonal polarization elements. In another example embodiment, the display device 1000 may display the three-dimensional image by a shutter glasses type among the glasses type. The shutter glasses type allow the user to feel the three-dimensional effect by alternatively shading left-eye image and right-eye image in response to synchronization signals for projecting left-eye image signal and right-eye image signal on a screen. In another example embodiment, the display device 1000 may display the three-dimensional image using a parallax barrier to show a stereoscopic image or multiscopic image without three-dimensional glasses. Therefore, the user RO can see the three-dimensional additional image including the left-eye image DO_L and the right-eye image DO_R with the reflection of the user MO.

As shown in FIG. 14, the display device 1000 may generate the additional image by a time slice manner progressively displaying images that are simultaneously captured by the plurality of camera modules.

For example, the display device 1000 may include first through eighth camera modules CM1 through CM8, and then the first through eighth camera modules CM1 through CM8 may capture the image for the subject RO at substantially the same time. The additional image may be generated using the images captured by the first through eighth camera modules CM1 through CM8 by the time slice manner. At this time, the first through eighth camera modules CM1 through CM8 may zoom in or zoom out to generate the additional image because distances between each the camera module and the subject RO are different from each other.

Figure 15:
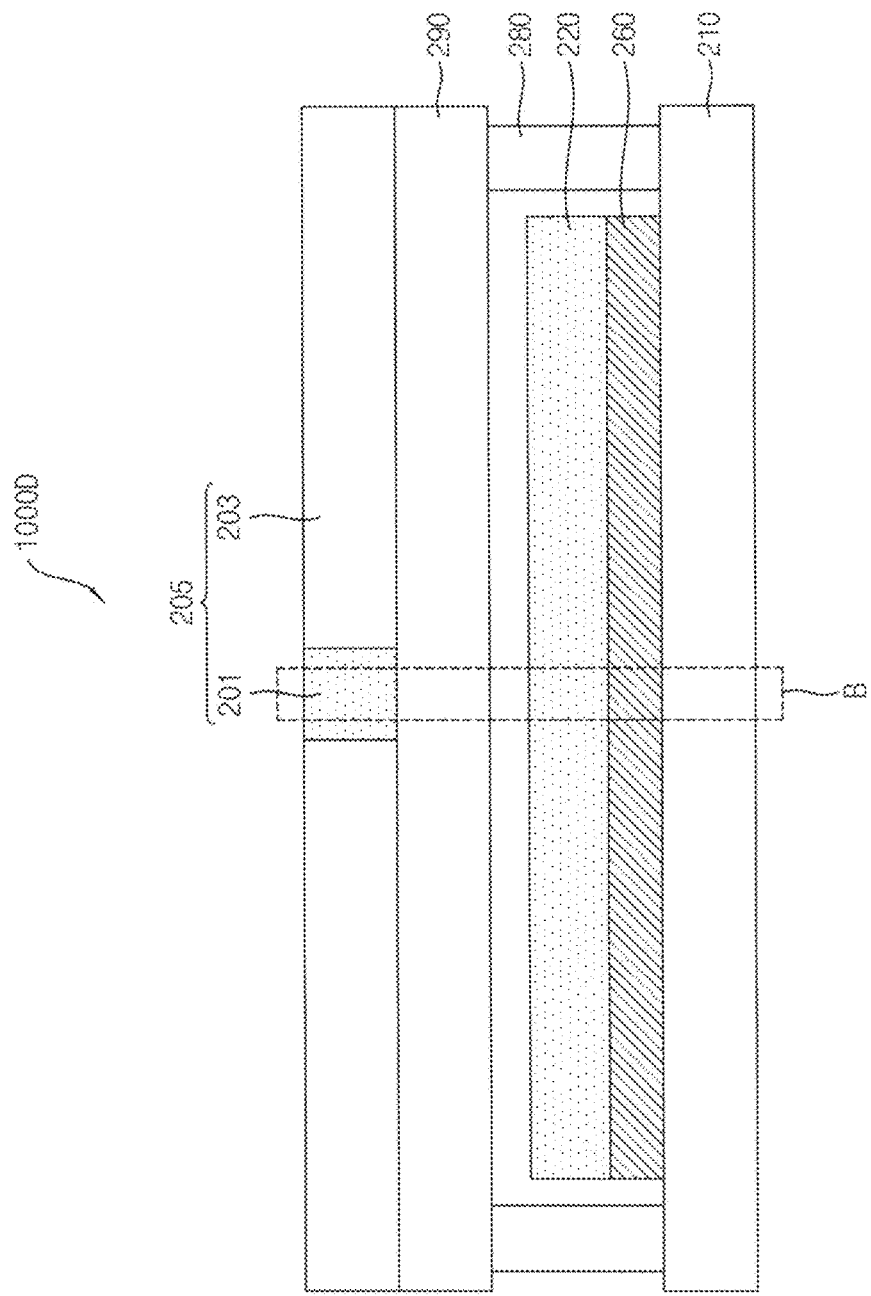
FIG. 15 is a cross-sectional view illustrating still another example of a display device of FIG. 1.
Figure 16:
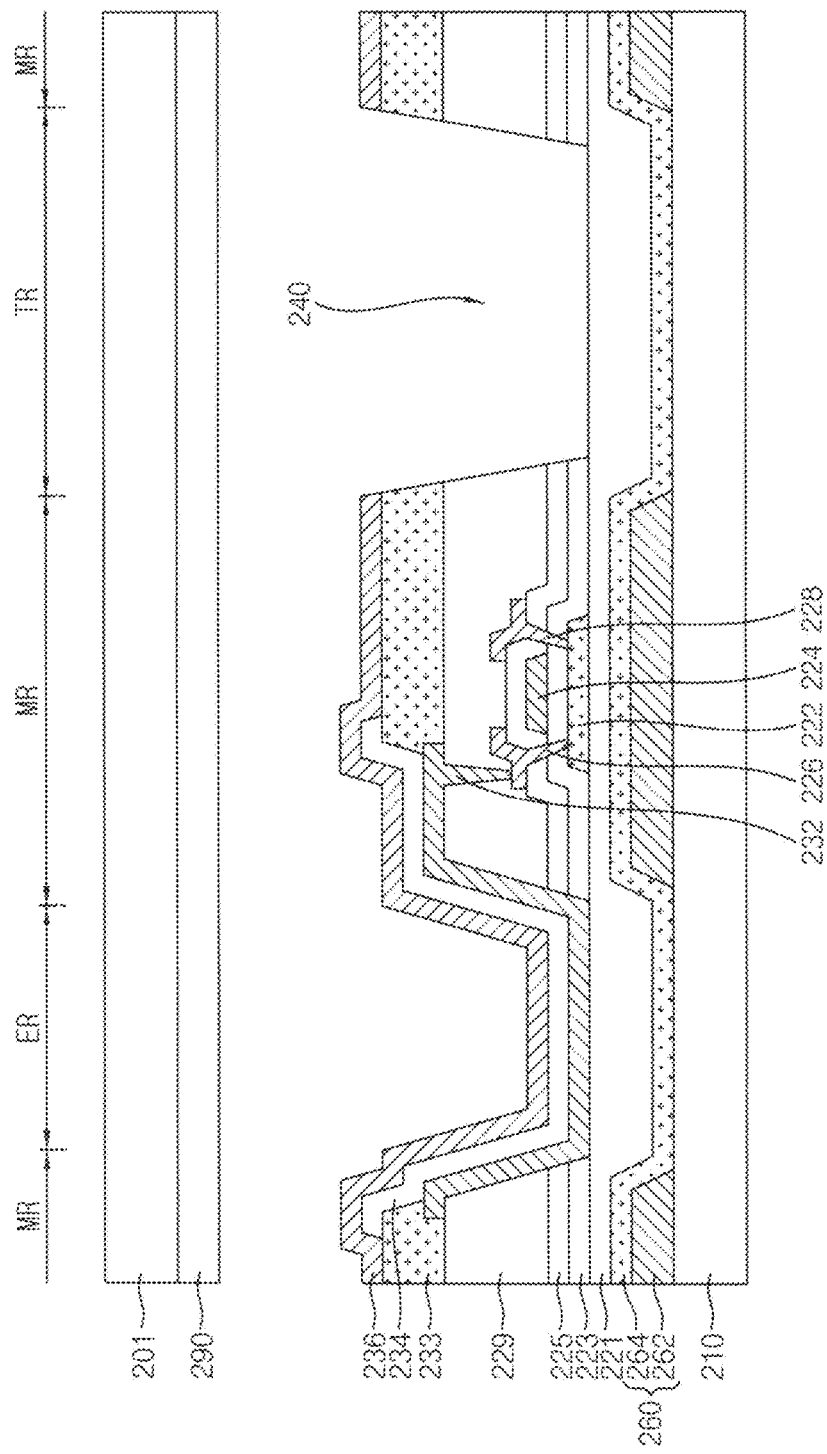
FIG. 16 is an enlarged view illustrating an example of a portion 'B' of FIG. 15.

FIG. 15 is a cross-sectional view illustrating still another example of a display device of FIG. 1. FIG. 16 is an enlarged view illustrating an example of a portion 'B' of FIG. 15.

Referring to FIGS. 15 and 16, the display device 1000D may include a camera unit 205, a first substrate 210, a display unit 220, a mirror member 260, and a second substrate 290.

The first substrate 210 and the second substrate 290 may include a glass substrate or a transparent plastic substrate. The second substrate 290 may opposite to the first substrate 210.

The mirror member 260 may be disposed on one side of the first substrate 210 that is an encapsulation unit. The mirror member 260 may reflect external light in order that the display device has the mirror property and the camera unit 205 located on one, side (e.g., upper side) of the second substrate does not recognized by users. The mirror member 260 may include a plurality of mirror patterns 262 and a mirror layer 264. The mirror patterns 262 may be disposed on the one side of the first substrate 210 and may be located in the mirror region MR. The second mirror layer 264 may be disposed on the mirror patterns 262 and the one side of the first substrate 210 and may be located in the emission region ER, the mirror region MR, and the transparent region TR. The mirror layer 264 may be disposed on the mirror patterns 262 and the one side of the first substrate 210 and may be located in the emission region ER, the mirror region MR, and the transparent region TR. The mirror patterns 262 may be located in the mirror region MR only and may have relatively high reflectivity, thereby increasing the reflectance of the mirror region MR. Also, because the mirror layer 264 is located in entire region (i.e., the emission region ER, the mirror region MR, and the transparent region TR) of the pixels and has relatively low reflectivity, an image displayed by the display unit 220 may be transmitted to the outside of the display device in the emission region ER and the camera unit 205 may capture the image through the transparent region TR. A barrier layer 221 may be formed on the mirror member 260. The barrier layer 221 may block impurity diffusion and may serve as a planarization layer.

The display unit 220 may be disposed on the first substrate 220 and may have bottom emission type structure. The display unit 220 may include a pixel having a sub-pixel and a transparent window 240. The sub-pixel may include a switching element disposed on the mirror member 260 and an organic light emitting display diode electrically connected to the switching element.

The switching element may include a thin film transistor (TFT) including an active pattern 222, a gate insulation layer 223, a gate electrode 224, a source electrode 226, and a drain electrode 228. Because a structure of the switching element is described above, duplicated descriptions will be omitted.

The organic light emitting diode may formed on the via insulation layer 229. In one example embodiment, the organic light emitting diode may be formed on the barrier layer 221 and the via insulation layer 229 on a region in which the via insulation layer 229, the insulating interlayer 225, the gate insulation layer 223 in the emission region ER are removed.

The organic light emitting diode may include a first electrode 232, a display layer 234, and a second electrode 236. The organic light emitting diode may be located in the emission region ER. Because a structure of the organic light emitting diode is described above, duplicated descriptions will be omitted.

The display unit 220 may have a transparent window 240 in the transparent region TR. In one example embodiment, the transparent window 240 may be formed by removing or not forming the second electrode 236, the pixel defining layer 233, the via insulation layer 229, the insulating interlayer 225, the gate insulation layer 223 in the transparent region TR. In one example embodiment, every pixel included in the display unit 220 may include the transparent window 240. In another example embodiment, the pixels overlapping the camera module 201 among the entire pixels may include the transparent window 240.

The camera unit 205 may be disposed on one side of the second substrate 290 (e.g., upper side). The camera unit 205 may include a camera module 201 to capture the image. The camera module 201 may capture the image through the transparent window 240 of the display unit 220. In one example embodiment, the camera unit 205 may further include a supporting member 203 surrounding the camera module 101. Because the camera unit 205 is described above, duplicated descriptions will be omitted.

Although the example embodiments of the FIG. 16 describe that the mirror layer 264 and the mirror patterns 262 may be disposed on the one side of the first substrate 210, it is not limited thereto. For example, the mirror layer may be disposed on the first side of the first substrate and the mirror patterns may be disposed on the second side of the first substrate and vice versa.

Figure 17:
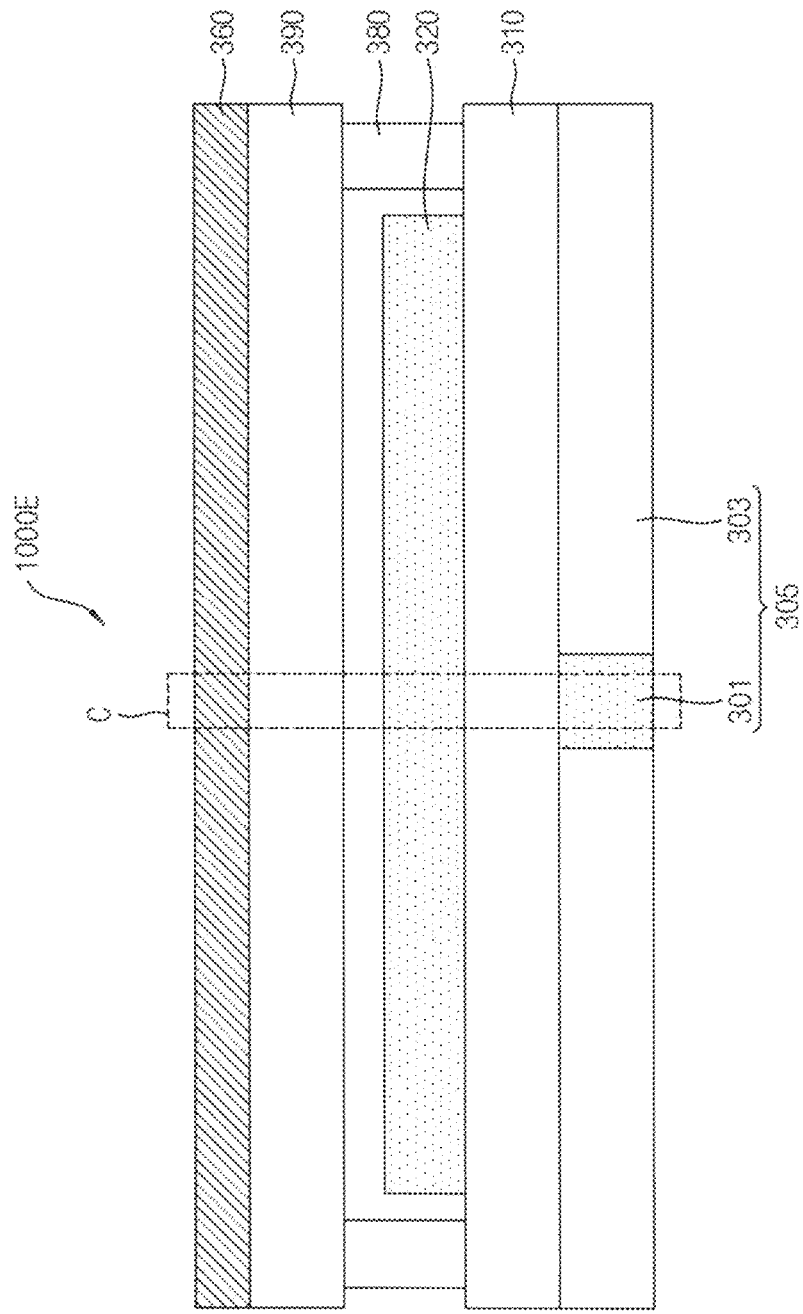
FIG. 17 is a cross-sectional view illustrating still another example of a display device of FIG. 1.
Figure 18:
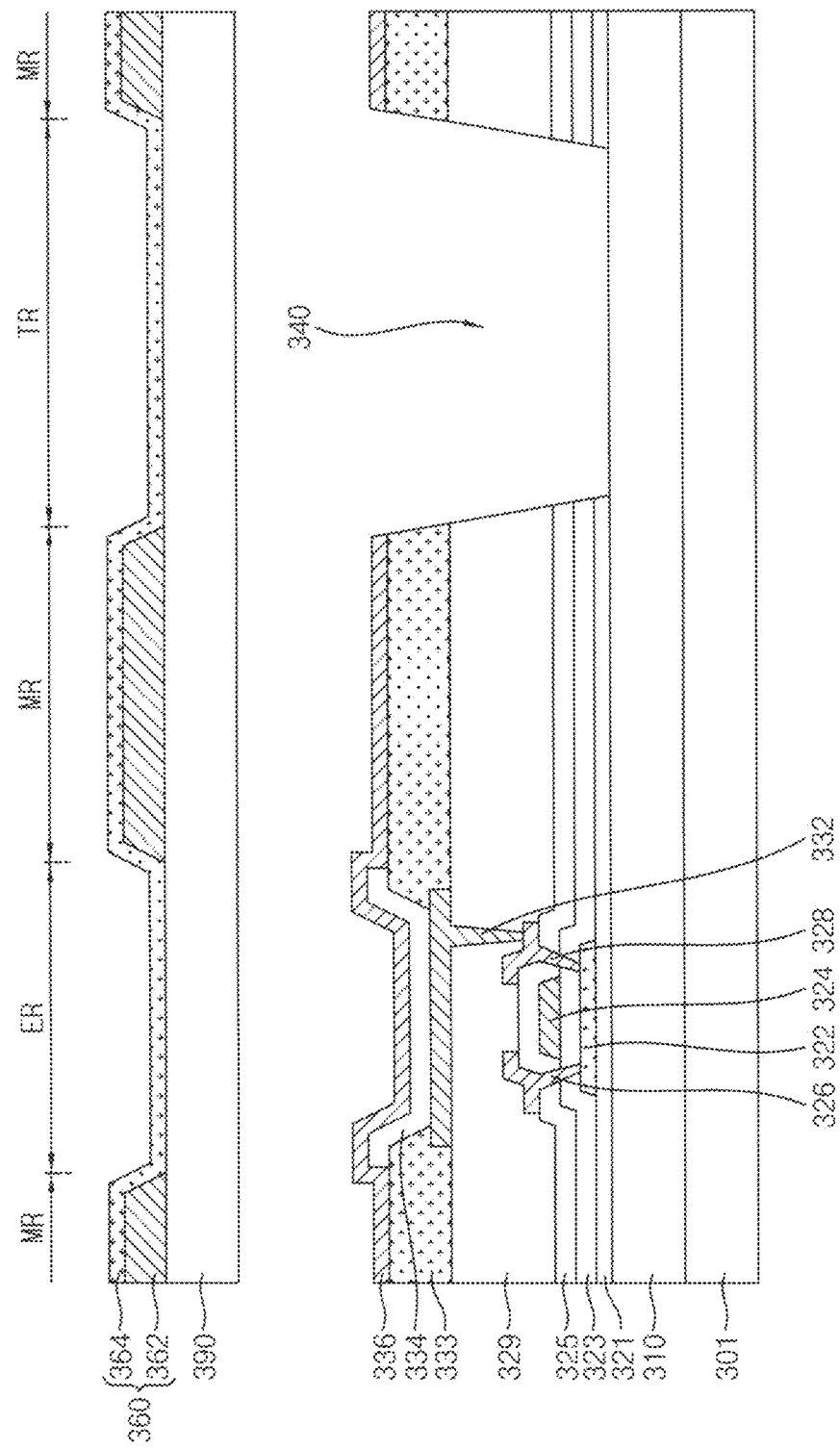
FIG. 18 is an enlarged view illustrating an example of a portion 'C' of FIG. 17.

FIG. 17 is a cross-sectional view illustrating still another example of a display device of FIG. 1. FIG. 18 is an enlarged view illustrating an example of a portion 'C' of FIG. 17.

Referring to FIGS. 17 and 18, the display device 1000E may include a camera unit 305, a first substrate 310, a display unit 320, a mirror member 360, and a second substrate 390. The display device 1000E according to the present exemplary embodiment is substantially the same as the display device of the exemplary embodiment described in FIGS. 2 and 3, except that the mirror member 360 is disposed on the first side (e.g., upper side) of the second substrate 390. Therefore, the same reference numerals will be used to refer to the same or like parts as those described in the previous exemplary embodiment of FIGS. 2 and 3, and any repetitive explanation concerning the above elements will be omitted.

The first substrate 310 and the second substrate 390 may include a glass substrate or a transparent plastic substrate. The second substrate 390 may opposite to the first substrate 310.

The display unit 320 may be disposed on the first side (e.g., upper side) of the first substrate 310 and have top emission type structure. The display unit 320 may include a pixel having a sub-pixel and a transparent window 340. The sub-pixel may include a switching element disposed on the first substrate 310 and an organic light emitting display diode electrically connected to the switching element.

The mirror member 360 may be disposed on the first side (e.g., upper side) of the second substrate 390. The mirror member 360 may reflect an external light in order that the display device has the mirror property and the camera unit 305 located on the back side of the first substrate 310 does not recognized by users. The mirror member 360 may include a plurality of mirror patterns 362 and a mirror layer 364. The mirror patterns 362 may be disposed on the first side (e.g., upper side) of the second substrate 390 and may be located in the mirror region MR. The mirror layer 364 may be disposed on the mirror patterns 362 and the first side (e.g., upper side) of the second substrate 390 and may be located in the emission region ER, the mirror region MR, and the transparent region TR.

The camera unit 305 may be disposed on the second side (e.g., lower side) of the first substrate 310. The camera unit 305 may include a camera module 301 to capture the image. The camera module 301 may capture the image through the transparent window 340 of the display unit 320. In one example embodiment, the camera unit 305 may further include a supporting member 303 surrounding the camera module 301.

Figure 19:
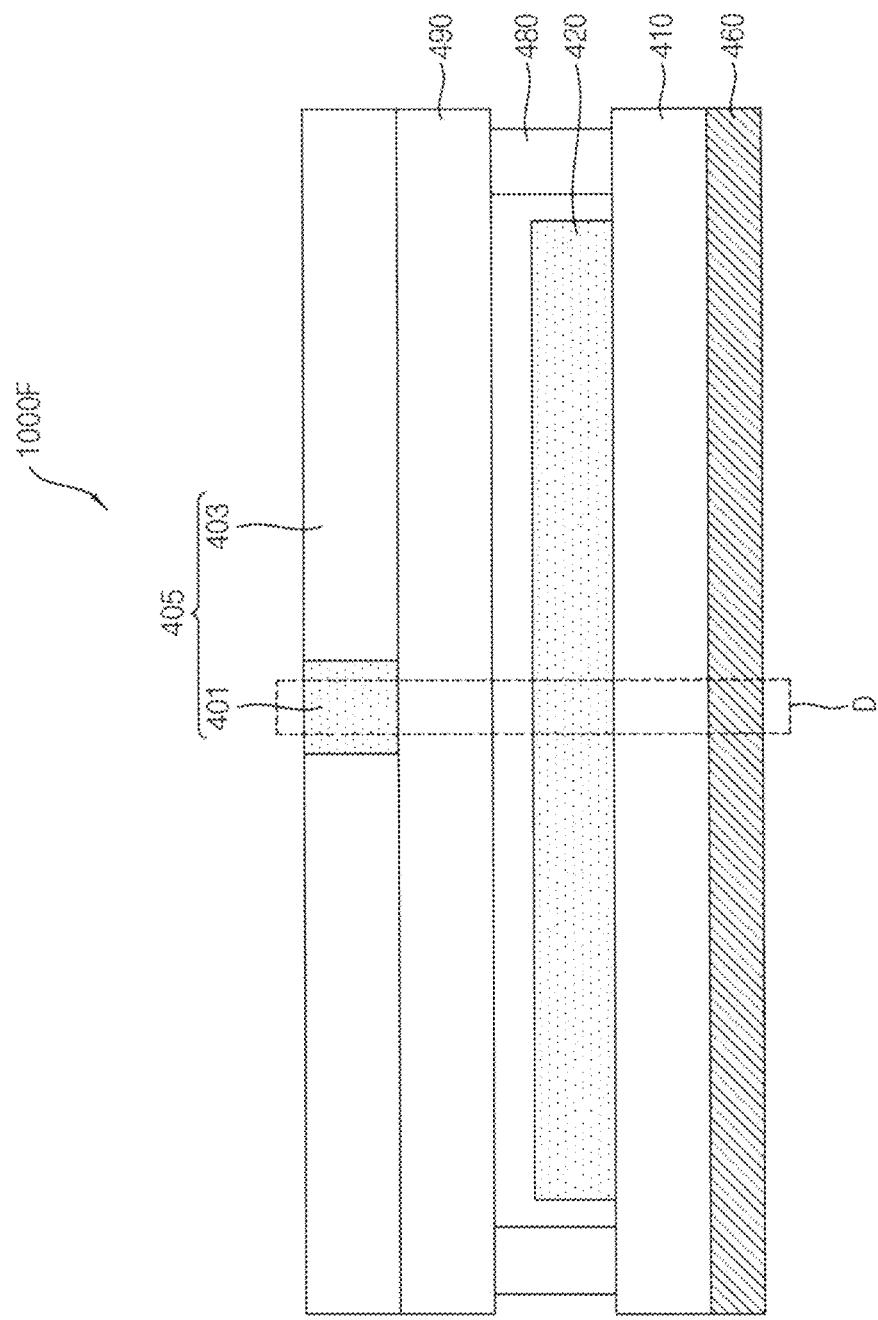
FIG. 19 is a cross-sectional view illustrating still another example of a display device of FIG. 1.
Figure 20:
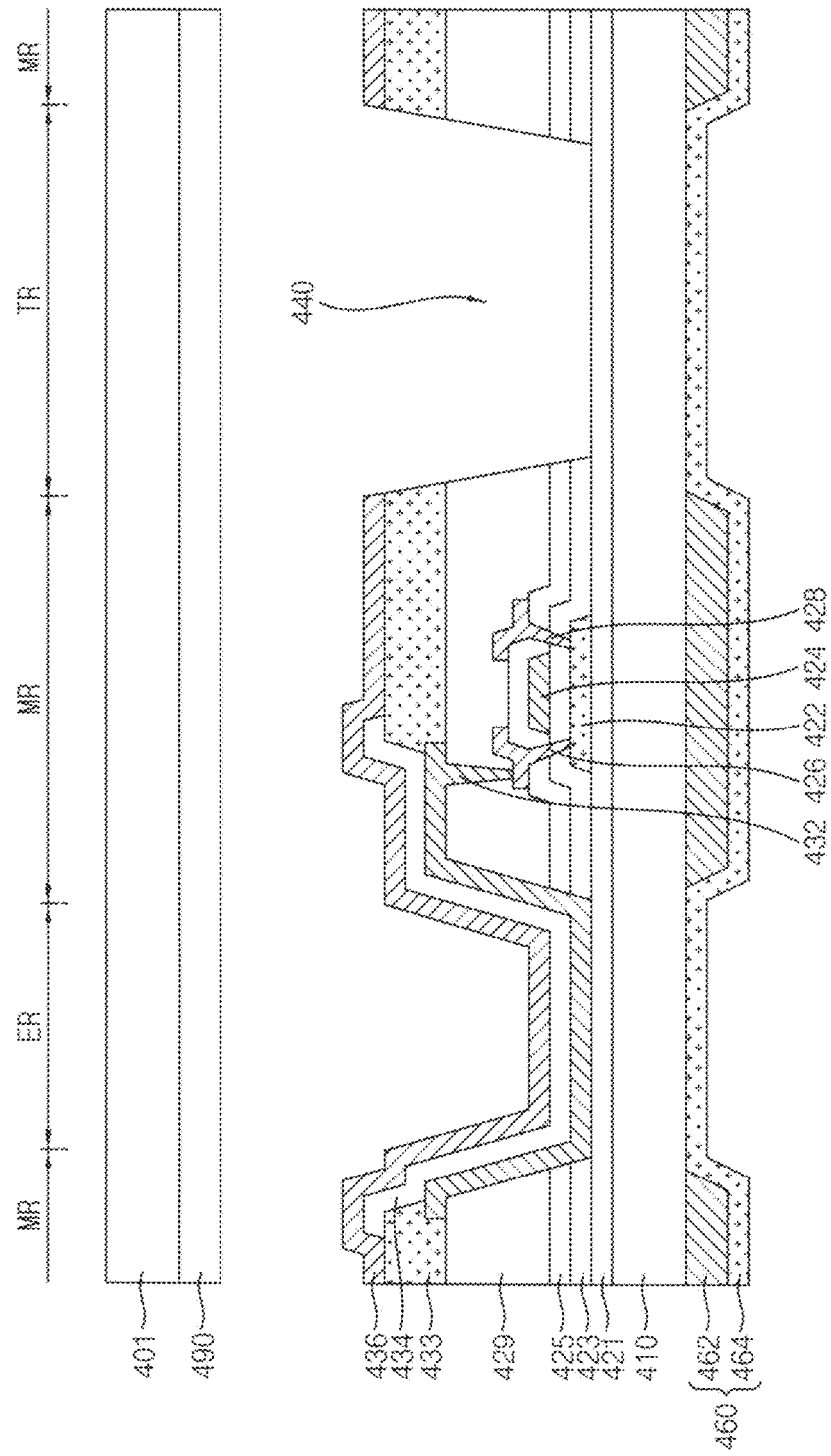
FIG. 20 is an enlarged view illustrating an example of a portion 'D' of FIG. 19.

FIG. 19 is a cross-sectional view illustrating still another example of a display device of FIG. 1. FIG. 20 is an enlarged view illustrating an example of a portion 'D' of FIG. 19.

Referring to FIGS. 19 and 20, the display device 1000F may include a camera unit 405, a first substrate 410, a display unit 420, a mirror member 460, and a second substrate 490. The display device 1000F according to the present exemplary embodiment is substantially the same as the display device of the exemplary embodiment described in FIGS. 15 and 16, except that the mirror member 460 is disposed on the second side (e.g., lower side) of the first substrate 410. Therefore, the same reference numerals will be used to refer to the same or like parts as those described in the previous exemplary embodiment of FIGS. 15 and 16, and any repetitive explanation concerning the above elements will be omitted.

The first substrate 410 and the second substrate 490 may include a glass substrate or a transparent plastic substrate. The second substrate 490 may opposite to the first substrate 410.

The display unit 420 may be disposed on the first side (e.g., upper side) of the first substrate 410 and have bottom emission type structure. The display unit 420 may include a pixel having a sub-pixel and a transparent window 440. The sub-pixel may include a switching element disposed on the mirror member 460 and an organic light emitting display diode electrically connected to the switching element.

The mirror member 460 may be disposed on the second side (e.g., lower side) of the first substrate '410. The mirror member 460 may reflect external light in order that the display device has the mirror property and the camera unit 405 located on the one side of the substrate (e.g., upper side) does not recognized by users. The mirror member 460 may include a plurality of mirror patterns 462 and a mirror layer 464. The mirror patterns 462 may be disposed on the second side (e.g., lower side) of the first substrate 410 and may be located in the mirror region MR. The mirror layer 464 may be disposed on the mirror patterns 462 and the second side (e.g., lower side) of the first substrate 410 and may be located in the emission region ER, the mirror region MR, and the transparent region TR.

The camera unit 405 may be disposed on the first side (e.g., upper side) of the second substrate 490. The camera unit 405 may include a camera module 401 to capture the image. The camera module 401 may capture the image through the transparent window 440 of the display unit 420. In one example embodiment, the camera unit 405 may further include a supporting member 403 surrounding the camera module 401.

Figure 21:
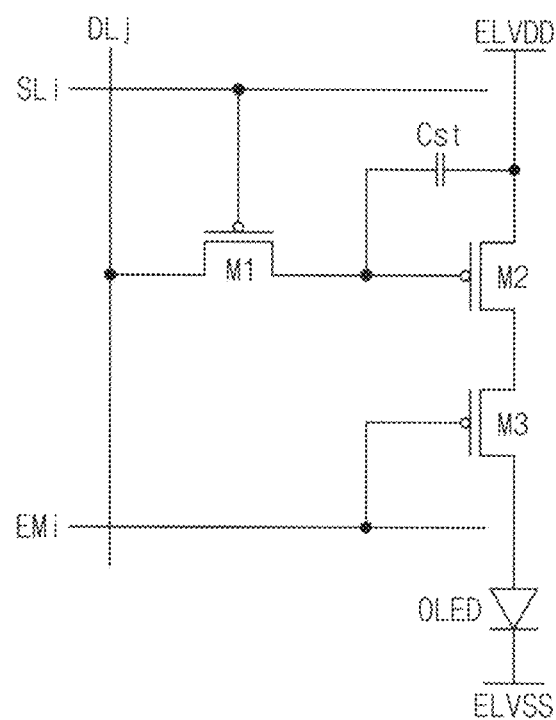
FIG. 21 is a circuit diagram illustrating an example of a pixel included in a display device of FIG. 1.

FIG. 21 is a circuit diagram illustrating an example of a pixel included in a display device of FIG. 1.

Referring to FIG. 21, the sub-pixel may include a pixel circuit for operating the pixels by a simultaneous emission driving manner. In one example embodiment, the pixel circuit may include first through third transistors M1 through M3 and a capacitor Cst.

The first transistor M1 may include a gate electrode connected to the scan line SLi, a first electrode connected to a data line DLj, and a second electrode connected to a gate electrode of the second transistor M2.

The second transistor M2 may include a gate electrode connected to the second electrode of the first transistor M1, a first electrode connected to a first power source ELVDD, and a second electrode connected to a first electrode of a third transistor M3.

The third transistor M3 may include a gate electrode connected to an emission control line EMi, a first electrode connected to the second electrode of the second transistor M2, and a second electrode connected to an anode electrode of an organic light emitting diode OLED.

The capacitor Cst may include a first electrode connected to the gate electrode of the second transistor M2 and a second electrode connected to the first electrode of the second transistor M2. The capacitor Cst may charge a data signal applied to the gate electrode of the second transistor M2 and may maintain the charged data signal after the first transistor M1 is turned off The organic light emitting diode OLED include the anode electrode connected to the second electrode of the third transistor M3 and the cathode electrode connected to the second power source ELVSS.

Although the example embodiments of the FIG. 21 describe that the pixel circuit of the sub-pixel includes the first through third transistors M1 through M3 and the capacitor Cst, the sub-pixel can include various pixel circuits for operating the pixels by the simultaneous emission driving manner.

Figure 22:
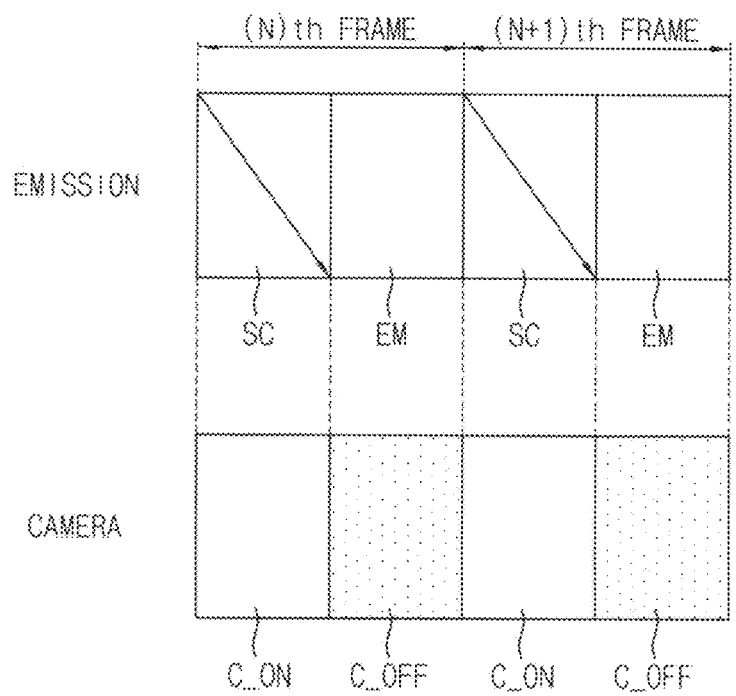
FIGS. 22 and 23 are diagrams illustrating examples of driving a camera unit included in a display device of FIG. 1 in synchronization with an operation of pixels.
Figure 23:
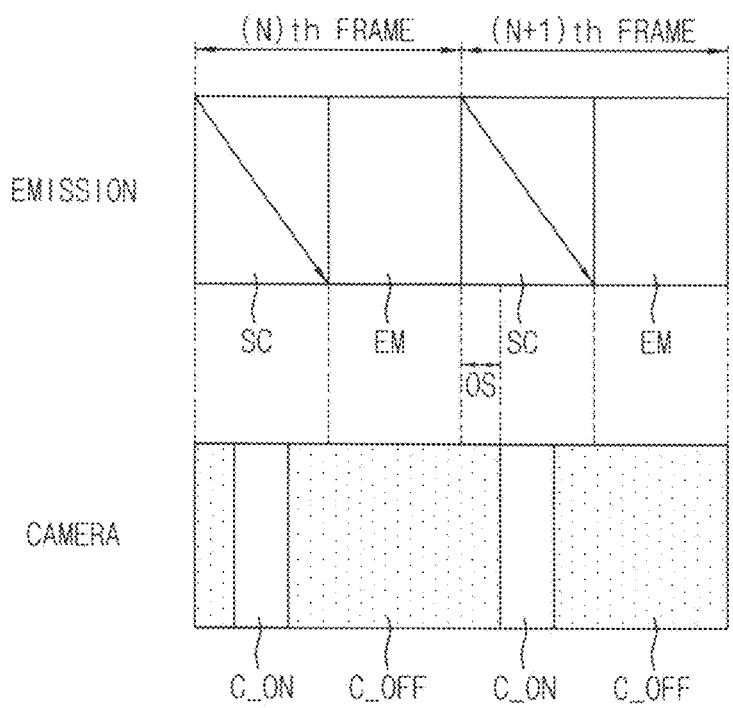
Figure 24:
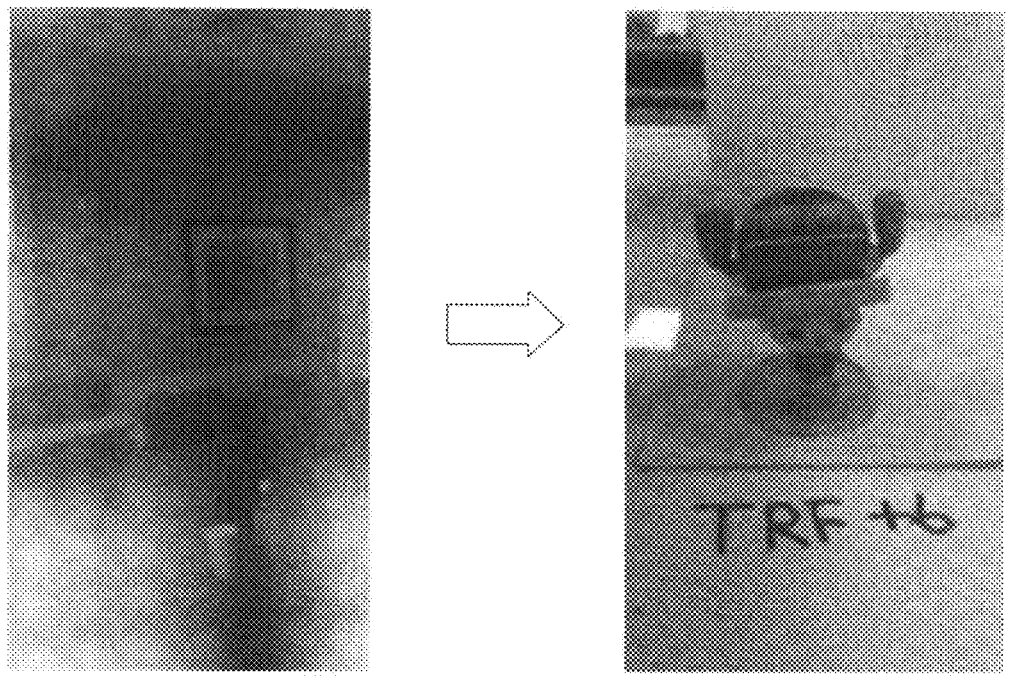
FIG. 24 is a diagram for describing an effect of driving a camera unit included in a display device of FIG. 1 in synchronization with an operation of pixels.

FIGS. 22 and 23 are diagrams illustrating examples of driving a camera unit included in a display device of FIG. 1 in synchronization with an operation of pixels. FIG. 24 is a diagram for describing an effect of driving a camera unit included in a display device of FIG. 1 in synchronization with an operation of pixels.

Referring to FIG. 22 through 24, a display driver may drive pixels by a simultaneous emission driving manner. In the simultaneous emission driving manner, a single frame is divided into a non-emission period in which the pixels do not emit the light (i.e., a non-emission state) and an emission period in which the pixels simultaneously emit the light (i.e., emission state). The controller may generate control signals such that the data signal is provided to the pixels in at least a part of the non-emission period. For example, the non-emission period may include an initialization period and a scan period. The pixel may be initialized in the initialization period by initialization operations (e.g., resetting a driving voltage of an organic light emitting diode or compensating a threshold voltage of a driving transistor). The scan signal may be applied to the pixel to charge the data signal to the pixel in the scan period. The organic light emitting diode may emit the light corresponding to the data signal in the emission period.

A camera driver of the display device may generate the camera control signal such that the camera unit is in a camera-off state in the emission period and is in a camera-on state in at least a part of the non-emission period. In one example embodiment, a period of the camera control signal is substantially the same as a period of the single frame to synchronize an operation of the camera unit with an operation of the pixel.

As shown in FIG. 22, in one example embodiment, the camera unit may be in the camera-on state C_ON in the non-emission period SC and may capture the image because the pixels do not emit the light in the non-emission period. On the other hand, the camera unit may be in the camera-off C_OFF state in the emission period to be unaffected by a displayed image because the pixels emit the light in the emission period EM.

As shown in FIG. 23, in another example embodiment, the camera unit may be in the camera-on state C_ON in at least a part of the non-emission period SC and may capture the image because the pixels do not emit the light in the non-emission period SC. Thus, because the captured image can be affected by the displayed image at the boundary of the non-emission period SC and emission period EM, an offset period OS may be set after changing from the emission period EM to the non-emission period SC. The camera unit may be in the camera-off C_OFF state in the offset period OS.

As shown in FIG. 24, if the camera module captures the image while the pixel display the image unlike the present inventive concept, the camera module may do not clearly capture the image because the camera module can be affected by displayed image. On the other hand, if the camera unit is turned-off during the emission period like the present inventive concept, the camera module clearly capture the image without an effect of the displayed image.

Although the example embodiments describe that each pixel includes three sub-pixels respectively emitting a red color light, a green color light, and a blue color light, a structure of the pixel is not limited thereto. For example, each pixel includes four sub-pixels respectively emitting a red color light, a green color light, a blue color light, and a white color light.

The present inventive concept may be applied to an electronic device including the display device having a mirror property. For example, the present inventive concept may be applied to an outdoor advertising device, a virtual reality device, a display for product promotion, etc. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display device comprising:
    a substrate;
    an encapsulation unit opposite to the substrate;
    a display unit disposed between the substrate and the encapsulation unit, the display unit including a pixel;
    a camera unit disposed on one side of the substrate, the camera unit including at least one camera module; and
    a mirror member disposed on one side of the encapsulation unit,
    wherein the pixel includes:
    a sub-pixel having an organic light emitting diode that is located in an emission region of a plurality of emission regions; and
    a transparent window located in a transparent region of a plurality of transparent regions,
    wherein the mirror member is physically apart from the organic light emitting diode, the mirror member includes:
    a plurality of mirror patterns disposed on the one side of the encapsulation unit, the mirror patterns located in a mirror region and including a plurality of openings overlapping the plurality of emission regions and the plurality of transparent regions in a plan view; and
    a mirror layer disposed on the mirror patterns and the one side of the encapsulation unit, the mirror layer located in the emission region, the mirror region, and the transparent region, and
    wherein a reflectivity of the mirror patterns is higher than a reflectivity of the mirror layer.

2. The display device of claim 1, wherein the mirror pattern includes at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo).

3. The display device of claim 1, wherein the mirror layer includes:
    a first mirror layer including at least one selected from the group consisting of aluminum (Al), chromium (Cr), silver (Ag), iron (Fe), platinum (Pt), mercury (Hg), nickel (Ni), tungsten (W), vanadium (V), and molybdenum (Mo); and
    a second mirror layer including at least one selected from the group consisting of indium tin oxide (ITO), indium zinc oxide (IZO), zinc oxide, and indium oxide.

4. The display device of claim 1, wherein the sub-pixel includes first through third sub-pixels that emit different color lights from each other; and
    wherein the transparent window is substantially collinear with one of the first through third sub-pixels.

5. The display device of claim 4, wherein the transparent window is substantially collinear with biggest one of the first through third sub-pixels.

6. The display device of claim 1, wherein the sub-pixel includes first through third sub-pixels that emit different color lights from each other; and
    wherein the transparent window includes first through third transparent windows that are substantially collinear with the first through third sub-pixels, respectively.

7. The display device of claim 1, wherein a ratio of a size of the transparent window to a size of the pixel ranges from about 3% to about 40%.

8. The display device of claim 1, wherein the camera unit further includes:
    a supporting member surrounding the camera module.

9. The display device of claim 1, wherein the camera unit further includes:
    a moving member connected to the camera module, the moving member configured to move the camera module.

10. The display device of claim 1, wherein the display unit is disposed on the minor member.

11. The display device of claim 1, wherein the encapsulation unit includes:
    an encapsulation layer including a first organic layer disposed on the display unit and a first inorganic layer disposed on the first organic layer.

12. The display device of claim 11, wherein the mirror member is disposed on the first organic layer or the first inorganic layer.

13. A display device comprising:
a display driver configured to provide a driving signal to a plurality of pixels;
a substrate;
an encapsulation unit opposite to the substrate;
a display unit disposed between the substrate and the encapsulation unit, the display unit including the plurality of pixels;
a camera unit disposed on one side of the substrate, the camera unit including at least one camera module and controlled based on a camera control signal; and
a mirror member disposed on one side of the encapsulation unit,
wherein each of the plurality of pixels includes:
a sub-pixel having an organic light emitting diode that is located in an emission region of a plurality of emission regions; and
a transparent window located in a transparent region of a plurality of transparent regions,
wherein the mirror member is physically apart from the organic light emitting diode, the mirror member includes:
a plurality of mirror patterns disposed on the one side of the encapsulation unit, the mirror patterns located in a mirror region and including a plurality of openings overlapping the plurality of emission regions and the plurality of transparent regions in a plan view; and
a mirror layer disposed on the mirror patterns and the one side of the encapsulation unit, the mirror layer located in the emission region, the mirror region, and the transparent region, and
wherein a reflectivity of the mirror patterns is higher than a reflectivity of the mirror layer.

14. The display device of claim 13, wherein the display driver includes:
a scan driver configured to provide a scan signal to the plurality of pixels;
a data driver configured to provide a data signal to the plurality of pixels;
an emission driver configured to provide an emission control signal to the plurality of pixels;
a camera driver configured to generate the camera control signal; and
a controller configured to control the scan driver, the data driver, the emission driver, and the camera driver.

15. The display device of claim 14, wherein the controller generates a control signal for operating the plurality of pixels by a simultaneous emission driving manner in which a single frame is divided into a non-emission period in which the plurality of pixels are in a non-emission state while the data signal is supplied to the plurality of pixels, and an emission period in which the plurality of pixels are in an emission state.

16. The display device of claim 15, wherein the camera driver generates the camera control signal such that the camera unit is turned-off in the emission period.

17. The display device of claim 15, wherein the camera driver generates the camera control signal such that the camera unit is turned-on during the non-emission period.

18. The display device of claim 15, wherein a period of the camera control signal is substantially the same as a period of the single frame.

19. The display device of claim 15, wherein the controller generates the control signal such that the data signal is supplied to the plurality of pixels in at least a part of the non-emission period.

20. The display device of claim 14, wherein the camera module includes first through (N)th camera modules, where N is an integer greater than 1.

21. The display device of claim 20, wherein the controller determines a position of a subject based on images captured by the first through (N)th camera modules and generates a control signal such that the plurality of pixels display an additional image corresponding to the position of the subject.

22. The display device of claim 21, wherein the controller generates the control signal such that the additional image is recognized as a three-dimensional image by displaying a left-eye image and a right-eye image captured by the first through (N)th camera modules.

23. The display device of claim 20, wherein the controller generates the control signal to progressively display images simultaneously captured by the first through (N)th camera modules.

* * * * *